United States Patent
Abe et al.

(10) Patent No.: US 10,461,222 B2
(45) Date of Patent: Oct. 29, 2019

(54) LIGHT-EMITTING ELEMENT COMPRISING SAPPHIRE SUBSTRATE WITH CONVEX PORTIONS

(71) Applicant: NICHIA CORPORATION, Anan-shi, Tokushima (JP)

(72) Inventors: Makoto Abe, Tokushima (JP); Keisuke Higashitani, Tokushima (JP); Naoki Azuma, Katsuura-gun (JP); Akiyoshi Kinouchi, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 105 days.

(21) Appl. No.: 15/691,551

(22) Filed: Aug. 30, 2017

(65) Prior Publication Data
US 2018/0062036 A1    Mar. 1, 2018

Related U.S. Application Data

(63) Continuation of application No. 15/044,868, filed on Feb. 16, 2016, now Pat. No. 9,773,946.

(30) Foreign Application Priority Data

Feb. 18, 2015  (JP) ................................ 2015-029835
Dec. 17, 2015  (JP) ................................ 2015-246747

(51) Int. Cl.
*H01L 33/00*   (2010.01)
*H01L 33/22*   (2010.01)
*H01L 33/16*   (2010.01)

(52) U.S. Cl.
CPC .............. *H01L 33/22* (2013.01); *H01L 33/16* (2013.01)

(58) Field of Classification Search
CPC ................................. H01L 33/16; H01L 33/22
See application file for complete search history.

(56) References Cited

U.S. PATENT DOCUMENTS 7,771,532 B2    8/2010  Uematsu et al.
7,772,585 B2    8/2010  Uematsu et al.
(Continued)

FOREIGN PATENT DOCUMENTS

CN    102255024 A     6/2013
EP    2 293 352 A1    3/2011
(Continued)

OTHER PUBLICATIONS

The Extended European Search Report issued in Application No. 16156090.9 dated Jul. 12, 2016.

*Primary Examiner* — Minh Loan Tran
(74) *Attorney, Agent, or Firm* — Foley & Lardner LLP

(57) ABSTRACT

A light-emitting element includes: a sapphire substrate having a c-plane at a main surface thereof; and a semiconductor layer provided at the main surface side of the sapphire substrate. The sapphire substrate includes a first unit including a first region, a second region, and a third region, wherein, when viewed from the main surface side, the three regions together have a shape of a regular hexagon that is evenly divided into the three regions such that each region has a shape of a rhombus; and a plurality of second units disposed to be aligned with each side of the first unit, the second unit having mirror symmetry relative to the first unit. The first unit and the second units are arranged to make a space at the center of the unit.

23 Claims, 19 Drawing Sheets

(56) References Cited

U.S. PATENT DOCUMENTS

| | | |
|---|---|---|
| 8,236,591 B2 | 8/2012 | Ichihara et al. |
| 8,779,463 B2 | 7/2014 | Narita et al. |
| 9,773,946 B2 * | 9/2017 | Abe .................. H01L 33/16 |
| 2007/0085093 A1 | 4/2007 | Ohmae et al. |
| 2010/0187542 A1 | 7/2010 | Ichihara et al. |
| 2011/0212559 A1 | 9/2011 | Ohmae et al. |
| 2011/0316041 A1 | 12/2011 | Narita et al. |
| 2012/0074431 A1 | 3/2012 | Narita et al. |
| 2012/0126241 A1 | 5/2012 | Okuno et al. |
| 2013/0270593 A1 | 10/2013 | Narita et al. |
| 2013/0285109 A1 | 10/2013 | Narita et al. |
| 2014/0306265 A1 | 10/2014 | Narita et al. |
| 2015/0228846 A1 | 8/2015 | Ohmae et al. |
| 2015/0270443 A1 | 9/2015 | Narita et al. |

FOREIGN PATENT DOCUMENTS

| | | |
|---|---|---|
| EP | 2 950 356 A1 | 12/2015 |
| JP | 2007-116097 A | 5/2007 |
| JP | 2007-134443 A | 5/2007 |
| JP | 2008-053385 A | 3/2008 |
| JP | 2008-091942 A | 4/2008 |
| JP | 2012-114204 A | 6/2012 |
| WO | WO-2009/020033 A1 | 2/2009 |
| WO | WO-2012/002240 A1 | 1/2012 |
| WO | WO-2012/018116 A1 | 2/2012 |

\* cited by examiner

LIGHT-EMITTING ELEMENT COMPRISING SAPPHIRE SUBSTRATE WITH CONVEX PORTIONS

CROSS-REFERENCE TO RELATED APPLICATION

This application is a Continuation of U.S. patent application Ser. No. 15/044,868, filed on Feb. 16, 2016, which claims priority to Japanese Patent Application No. 2015-029835, filed on Feb. 18, 2015, and Japanese Patent Application No. 2015-246747, filed on Dec. 17, 2015, the disclosures of which are hereby incorporated by reference in their entireties.

BACKGROUND OF THE INVENTION

Field of the Invention

The present disclosure relates to light-emitting elements.

Description of the Related Art

In general, a light-emitting element (light-emitting diode: LED) including a semiconductor, such as a nitride semiconductor, is usually configured by stacking an n-type semiconductor layer, an active layer, and a p-type semiconductor layer over a sapphire substrate in this order. To improve light extraction efficiency of the light-emitting element, some techniques are conventionally proposed that involve previously forming elongated concave portions or a composite structure of elongated concave and convex portions on a sapphire substrate (see JP 2008-53385 A, JP 2008-91942 A, and JP 2012-114204 A).

SUMMARY OF THE INVENTION

The object of certain embodiments of the present invention is to provide a light-emitting element that has a semiconductor layer exhibiting excellent crystal orientation while being capable of further reducing a dislocation density.

In order to solve the foregoing matter, a light-emitting element according to one aspect of the present disclosure is provided which includes: a sapphire substrate having a c-plane at a main surface thereof; and a semiconductor layer provided on a side of the main surface of the sapphire substrate, wherein the sapphire substrate includes: a first unit including a first region, a second region, and a third region, which are produced by partitioning the sapphire substrate in such a manner as to evenly divide a regular hexagon into three rhombuses as viewed from the main surface side, the first region being partitioned by respective sides parallel to a first m axis and a second m axis, the second region being partitioned by respective sides parallel to the second m axis and a third m axis, the third region being partitioned by respective sides parallel to the first m axis and the third m axis; and a plurality of second units disposed to be aligned with each side of the first unit, the second unit having mirror symmetry relative to the first unit with respect to an a axis passing through an apex of the first unit, wherein the first unit includes: a plurality of first convex portions arranged in the first region, each of the first convex portions having, at an outer edge thereof, a side parallel to the first m axis; a plurality of second convex portions arranged in the second region, each of the second convex portions having, at an outer edge thereof, a side parallel to the second m axis; and a plurality of third convex portions arranged in the third region, each of the third convex portions having, at an outer edge thereof, a side parallel to the third m axis, and wherein the first convex portion located closest to a center of the regular hexagon is disposed not to intersect a tangent line that is in parallel to the third m axis and in contact with an end on the center side of the second convex portion located closest to the center, and the second convex portion located closest to the center of the regular hexagon is disposed not to intersect a tangent line that is in parallel to the first m axis and in contact with an end on the center side of the third convex portion located closest to the center.

Alternatively, in order to solve the foregoing matter, a light-emitting element according to another aspect of the present disclosure may be provided which includes: a sapphire substrate; and a semiconductor layer provided on a side of a main surface of the sapphire substrate, wherein the sapphire substrate has on the main surface side, a plurality of first units and a plurality of second units, the first and second units having respective regular hexagonal regions, wherein the first unit includes a plurality of first convex portions provided in each of three rhombic regions formed by evenly dividing the regular hexagonal region into three, wherein the first convex portions in one rhombic region extend in parallel to one pair of opposed sides and are arranged along the other pair of opposed sides, an extending direction forming an angle of 60 degrees with respect to another extending direction of the convex portions provided in two other adjacent rhombic regions, wherein the second unit has mirror symmetry relative to the first unit when defining, as a reference, a line parallel to a perpendicular bisector of one side included in the regular hexagonal region of the first unit, and wherein the regular hexagonal region of the first unit is formed by arranging the six second units for the one first unit, and six sides of the regular hexagonal region of the first unit are aligned with facing sides of respective regular hexagonal regions of the six second units.

Accordingly, the light-emitting element in the embodiments of the present disclosure can have the semiconductor layer exhibiting excellent crystal orientation while being capable of further reducing the dislocation density.

DETAILED DESCRIPTION OF THE EMBODIMENT

Figure 1:
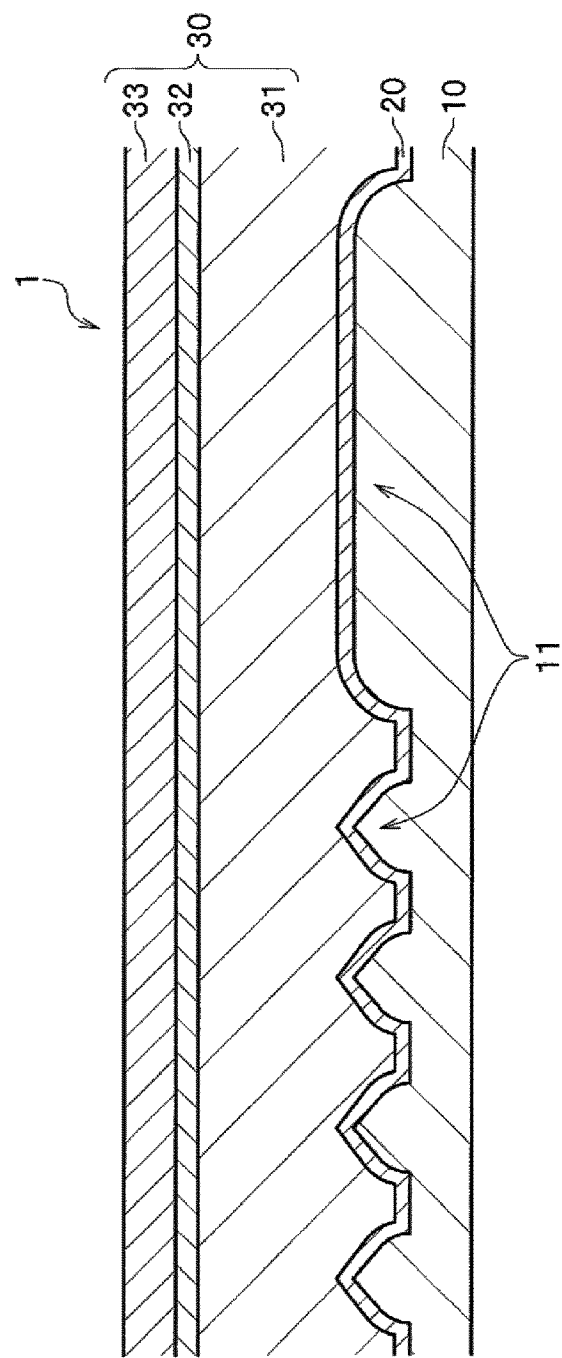
FIG. 1 is a schematic cross-sectional view showing the entire structure of a light-emitting element according to a first embodiment.

A light-emitting element and a manufacturing method therefor according to each of embodiments will be described with reference to the accompanying drawings. The drawings referred in the description below schematically illustrate the respective embodiments. Some drawings emphasize the scale, interval, positional relationship, and the like of each member, or omit the illustration of the member. In the description below, the same names or reference characters denote the same or similar member in principle, and thus a detailed redundant description thereof will be omitted as appropriate.

First Embodiment

[Light-Emitting Element Structure]

A light-emitting element according to a first embodiment will be described as the structure of a nitride semiconductor element as an example with reference to FIGS. 1 to 7. A light-emitting element 1 has a laminated structure including a sapphire substrate 10, a buffer layer 20, and a nitride semiconductor layer 30 that are stacked in this order.

Figure 3:
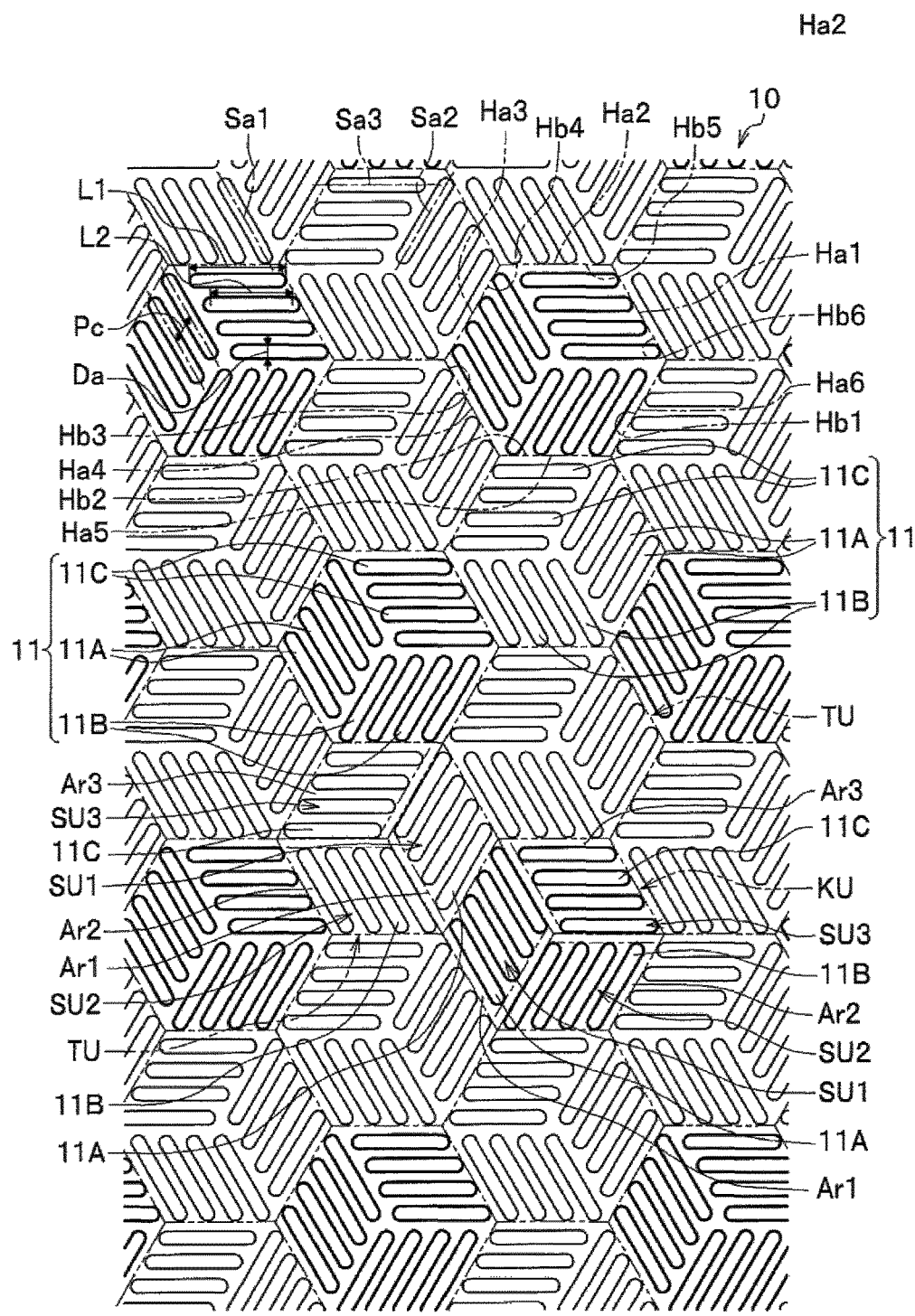
FIG. 3 is an enlarged plan view schematically showing a part of the sapphire substrate in the light-emitting element of the first embodiment.

As shown in FIGS. 1 and 3, the sapphire substrate 10 is for growing a nitride semiconductor (e.g., GaN) while supporting the nitride semiconductor layer 30. The sapphire substrate 10 has, at its upper surface on a c-plane side as a main surface side, a plurality of convex portions 11 formed in an elongated shape in the plan view. The sapphire substrate 10 has a thickness, for example, of 50 μm to 300 μm as a whole, including the convex portions 11 (first convex portions 11A, second convex portions 11B, and third convex portions 11C). The first to third convex portions 11A to 11C will be regarded as the convex portions 11 when collectively being explained.

Figure 2A:
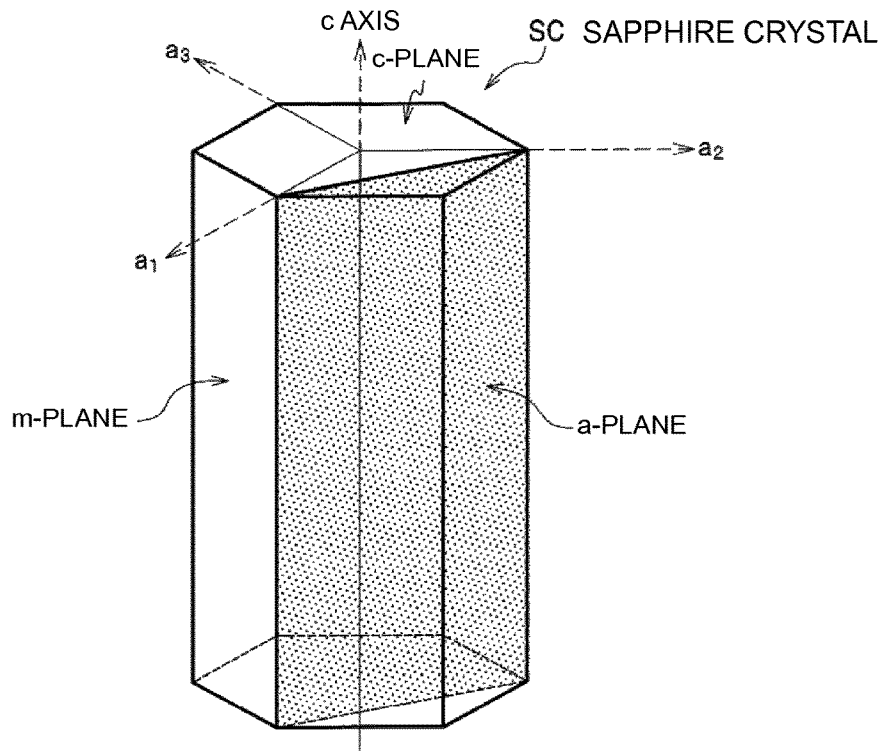
FIG. 2A is a unit cell diagram schematically showing plane orientations of a sapphire crystal in a sapphire substrate.
Figure 2B:
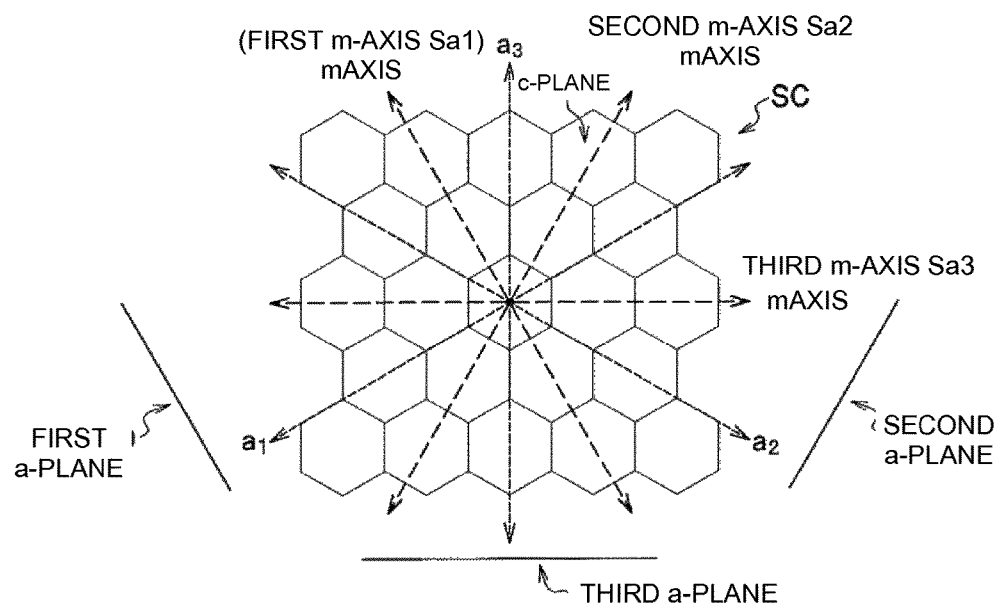
FIG. 2B is a plan view of a sapphire crystal structure schematically showing the plane orientations of the sapphire crystal in the sapphire substrate.

The convex portion 11 can form the nitride semiconductor layer 30 that has a reduced dislocation density and exhibits excellent crystal orientation as a result of improving the flatness when growing crystals of a nitride semiconductor on the sapphire substrate 10. Here, as shown in FIGS. 2A and 2B, the sapphire substrate 10 is formed of a sapphire crystal SC having a hexagonal crystal structure, and has a c-plane ((0001) surface) as a main surface. Note that the "c-plane" as used in the present specification may include a surface that is slightly inclined by an off angle relative to the c-plane. The off angle is, for example, approximately 3° or less. The above-mentioned convex portion 11 is formed at the surface on the c-plane side as the main surface. Referring to the unit cell diagram, the sapphire crystal SC has six m-planes as side surfaces of a hexagonal cylinder, and three a-planes respectively perpendicular to the $a_1$ axis, the $a_2$ axis, and the $a_3$ axis, that is, a first a-plane, a second a-plane, and a third a-plane, in addition to the c-plane. The direction perpendicular to the m-plane is the m-axis direction. The m-axis directions include three directions respectively extending and displaced by 30 degrees relative to the $a_1$ axis, the $a_2$ axis, and the $a_3$ axis. The m axes are respectively positioned in parallel to the first to third a-planes, and hereinafter referred to as a first m axis Sa1, a second m axis Sa2, and a third m axis Sa3, respectively.

Figure 4A:
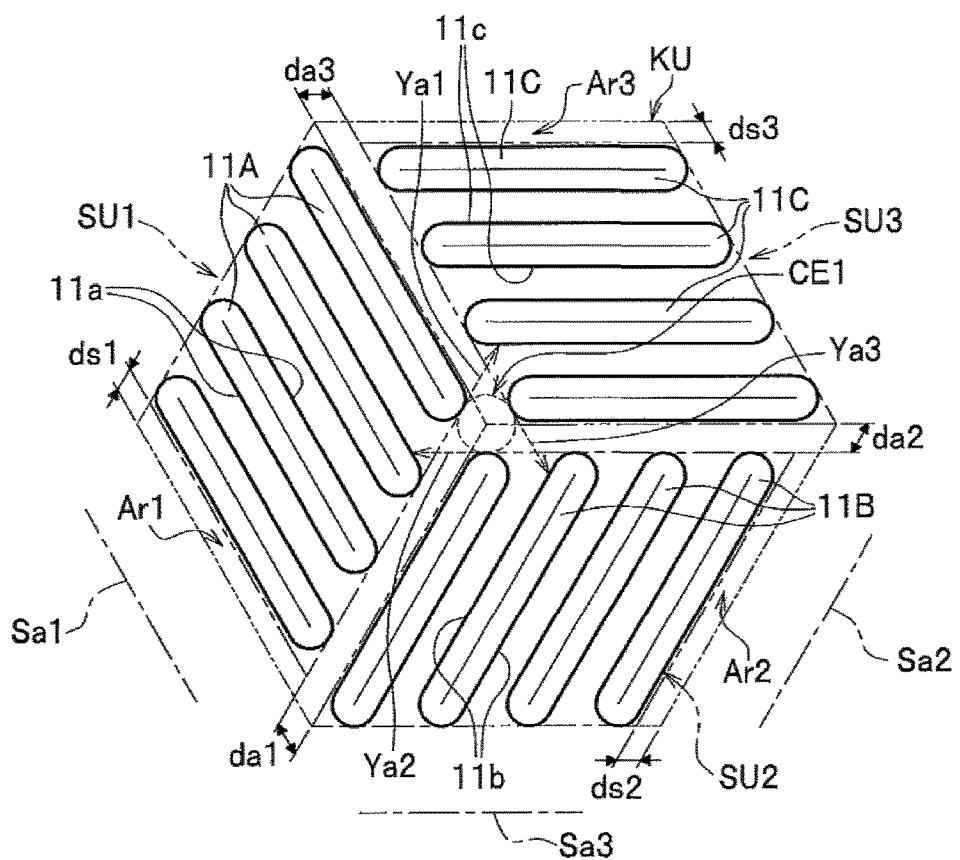
FIG. 4A is an enlarged plan view schematically showing convex portions formed at the substrate of the light-emitting element in the first embodiment.

As illustrated in FIGS. 3 and 4A, all convex portions 11 have the same shape. The predetermined number of convex portions 11 (for example, three to five convex portions; four convex portions in FIG. 3) are formed to be arranged in parallel at predetermined intervals along any one of the first m axis Sa1, the second m axis Sa2, and the third m axis Sa3. The convex portions 11 (first to third convex portions 11A to 11C) are preferably placed, for example, at an interval (with the shortest distance therebetween) of 0.3 μm to 4 μm in the longitudinal direction and transverse direction. The length in the longitudinal direction of the convex portion 11 (whole core length L1) and the length in the transverse direction (core diameter Da) are preferable set in a range of 5 μm to 25 μm, and in a range of 1 μm to 5 μm, respectively.

The height of the convex portion 11 is preferably set, for example, in a range of 0.5 μm to 2.5 μm.

In the convex portion 11, the length in the longitudinal direction of the elongated shape in the plan view (length in parallel to each of the m axes Sa1 to Sa3) is preferably three or more times (more preferably, 6 to 15 times, or 5 to 12 times) as long as that in the transverse direction (length perpendicular to each of the m axes Sa1 to Sa3). The convex portion 11 has both ends in the longitudinal direction formed in the substantially same shape. Here, the convex portion 11 has a linear part with both ends thereof formed in a semicircular shape in the plan view. Note that the length of the linear part in the longitudinal direction of the convex portion 11 is defined as a core length L2, and the length of the convex portion 11 from one end to the other thereof is defined as the whole core length L1. Here, the convex portion 11 is formed in such a manner that the ratio of the core length L2 to the whole core length L1 is, for example, in a range of 1:1.05 to 1.6.

The convex portions 11 have, as their sides 11a to 11c, the linear parts positioned at their outer edges in parallel to the m axes Sa1 to Sa3, respectively. For example, the first convex portion 11A is formed to have the opposed linear sides 11a in parallel to the first m axis Sa1, and arc outer edges located at both ends of the sides 11a in the plan view. The first convex portion 11A is positioned to form an angle of 60 degrees with respect to the extending directions of the second convex portion 11B and the third convex portion 11C. Note that the second convex portion 11B and the third convex portion 11C have the substantially same structure, and thus a detailed description thereof is made below.

Figure 5A:
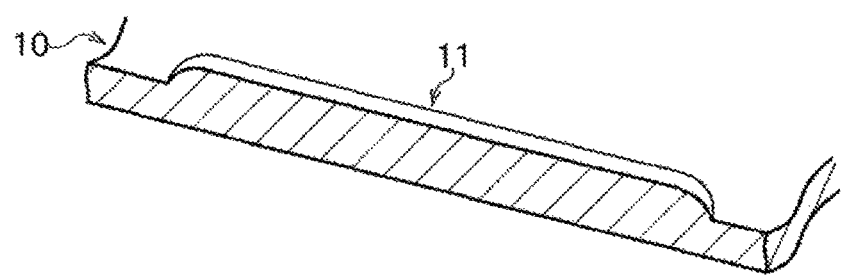
FIG. 5A is a cross-sectional view taken along the line X1-X1 of FIG. 4B, showing the convex portion formed at the substrate of the light-emitting element in the first embodiment.
Figure 5B:
FIG. 5B is a cross-sectional view taken along the line X2-X2 of FIG. 4B, showing the convex portion formed at the substrate of the light-emitting element in the first embodiment.
Figure 5C:
FIG. 5C is a cross-sectional view taken along the line X3-X3 of FIG. 4B, showing the convex portion formed at the substrate of the light-emitting element in the first embodiment.

As shown in FIGS. 5A to 5C, the convex portion 11 has its section with a sharpened and not flat upper part thereof in the transverse direction (direction perpendicular to a corresponding one of the m axes Sa1 to Sa3). That is, the convex portion 11 is formed to have an apex with a triangle cross-sectional shape in the transverse direction extending from a predetermined position in height to the apex. This means that the convex portion 11 is formed in a domical shape that has its side surfaces inclined relative to the c axis, which is an axis perpendicular to the upper surface of the sapphire substrate 10.

The total number of convex portions 11 is determined depending on the area of the sapphire substrate 10, taking into consideration the interval between the respective convex portions 11 and the length of each convex portion 11. For example, the convex portions 11 are evenly distributed across the entire surface of the sapphire substrate 10.

In the first embodiment, as shown in FIGS. 3 and 4A, the convex portions 11 include the first convex portions 11A disposed along the first m axis Sa1, the second convex portions 11B disposed along the second m axis Sa2, and the third convex portions 11C disposed along the third m axis Sa3. A group of first convex portions 11A (first convex portion group) is referred to as a first sub-unit SU1; a group of second convex portions 11B (second convex portion group) is referred to as a second sub-unit SU2; and a group of third convex portions 11C (third convex portion group) is referred to as a third sub-unit SU3.

The first convex portions 11A are disposed in a first region Ar1 as one of virtual rhombic regions obtained by evenly dividing an virtual regular hexagon into three pieces; the second convex portions 11B are disposed in a second region Ar2 as another rhombic region mentioned above; and third convex portions 11C are disposed in a third region Ar3 as the above-mentioned remaining rhombic region. The first region Ar1 with the first convex portions 11A formed therein, the second region Ar2 with the second convex portions 11B formed therein, and the third region Ar3 with the third convex portions 11C formed therein are gathered together to form the virtual hexagonal region, which is defined as a first unit KU. That is, the first unit KU is evenly divided into three regions, namely, the first region Ar1 to the third region Ar3. The first convex portions 11A to the third convex portions 11C have three-fold rotational symmetry in the first unit KU.

The first region Ar1 is set as a rhombic region disposed in the first unit KU having the regular hexagon, the rhombic region having its sides in parallel to the first m axis Sa1 and the second m axis Sa2. The second region Ar2 is set as a rhombic region disposed in the first unit KU having the regular hexagon, the rhombic region having its sides in parallel to the second m axis Sa2 and the third m axis Sa3. The third region Ar3 is set as a rhombic region disposed in the first unit KU having the regular hexagon, the rhombic region having its sides in parallel to the first m axis Sa1 and the third m axis Sa3.

Figure 4B:
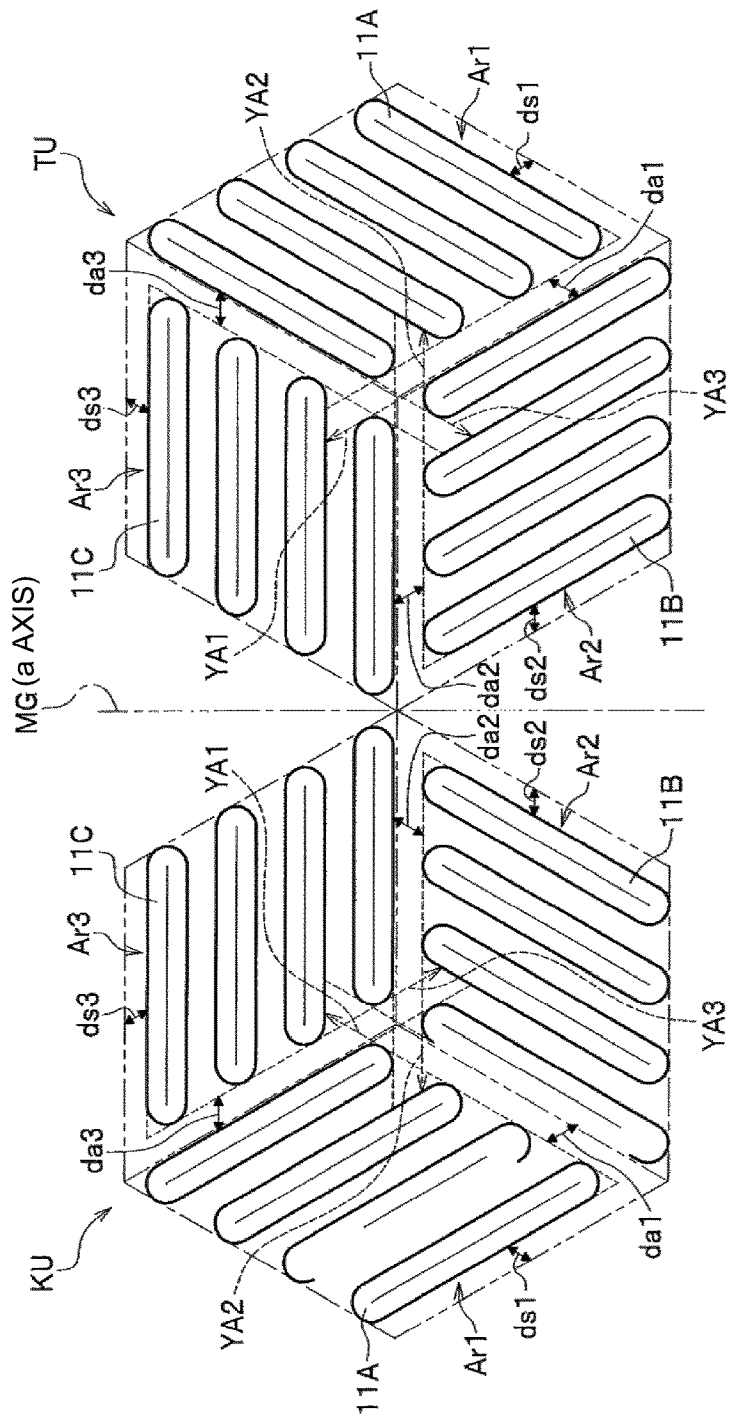
FIG. 4B is a schematic enlarged plan view for explaining a first unit and a second unit each of which represents a group of convex portions formed at the sapphire substrate of the light-emitting element in the first embodiment.

As shown in FIGS. 3 and 4B, the sapphire substrate 10 is configured to form a unit pattern by the first unit KU and a second unit TU that has mirror symmetry with respect to the first unit KU. The unit pattern is formed by combining the arrangement of the first, second, and third regions Ar1, Ar2, and Ar3 of the first unit KU forming one virtual regular hexagon, with the second unit TU which has mirror symmetry relative to the first unit and forms another virtual regular hexagon. Here, in the combination of the first unit KU and the second unit TU, each side of the virtual regular hexagon of the first unit KU is aligned with one side of the corresponding virtual regular hexagon of the second unit TU, thereby forming the unit pattern.

Note that the regular hexagons virtually partitioned by the first unit KU and the second unit TU are formed by virtual reference lines for positioning the first convex portions 11A to the third convex portions 11C, but not actually formed on the substrate. The rhombuses imaginarily partitioned as the first region Ar1 to the third region Ar3, or as the first sub-unit SU1 to third sub-unit SU3 are formed by the virtual reference lines but not actually formed on the substrate.

The relationship of the mirror (mirror image) symmetry between the first unit KU and the second unit TU means that as shown in FIG. 4B, the first region Ar1 to third region Ar3 of the virtual-regular-hexagonal first unit KU positioned on one side via a symmetry axis MG are positioned to overlap with the first region Ar1 to third region Ar3 of the virtual-regular-hexagonal second unit TU, which are positioned mirror-symmetrically, when the first unit is copied as the mirror image on the other side of the symmetry axis MG. Then, the second unit TU is moved in parallel to itself from the apex as a starting point, whereby the second unit TU is aligned with each side of the first unit KU. For example, as shown in FIG. 3, a side Ha1 of the first unit KU is aligned with a side Hb6 of the second unit TU. Likewise, a side Ha2 is aligned with a side Hb5; a side Ha3 with a side Hb4; a side Ha4 with a side Hb3; a side Ha5 with a side Hb2; and a side Ha6 with a side Hb1.

Here, the first unit KU is displaced to have mirror symmetry with its apex as the starting point and then moved in parallel to itself to make alignment of the respective sides between the first and second units. The same goes for the second unit TU that has mirror symmetric with respect to the first unit KU one side of which is parallel to the symmetry axis MG. That is, the second unit TU should have the mirror symmetry with respect to the first unit KU, regarding the arrangement relationship of the first region Ar1 to third region Ar3. Note that the second unit TU obtained by setting one side of the first unit KU parallel to the symmetry axis MG is displaced by an angle of 30 degrees and moved in parallel to itself, so that the sides Hb1 to Hb6 are aligned to the respective sides Ha1 to Ha6 of the first unit UK to thereby form the unit pattern as mentioned above. As shown in FIG. 4B, in the second unit TU, the first convex portion 11A has mirror symmetry to that of the first unit, and the inclination direction of the first convex portion is set to form an inclination angle along the second m axis as illustrated in the figure. Further, in the second unit TU, the second convex portion 11B has mirror symmetry to that of the first unit, and the inclination direction of the second convex portion is set to form an inclination angle along the first m axis as illustrated in the figure.

In other words, the second unit TU has the mirror symmetry with respect to the first unit KU when defining, as a reference, a straight line parallel to a perpendicular bisector of one side included in the regular hexagonal region of the first unit KU (in which the convex portion 11 is arranged to be rotated by 180 degrees with respect to the reference straight line). Further, six second units TU are arranged for one first unit KU such that each of the six sides Ha1 to Ha6 of the regular hexagonal region of the one first unit KU is aligned with one of the sides Hb1 to Hb6 of the regular hexagonal regions of the six second units TU.

As shown in FIG. 4B, in the second unit TU, the first convex portion 11A has mirror symmetry to that of the first unit, and the inclination direction of the first convex portion is set to form an inclination angle along the second m axis as illustrated in the figure. Further, in the second unit TU, the second convex portion 11B has mirror symmetry to that of the first unit, and the inclination direction of the second convex portion is set to form an inclination angle along the first m axis as illustrated in the drawing.

As illustrated in FIGS. 3 and 4A, the plurality of first convex portions 11A are respectively formed along the first m axis Sa1 to form the same shape. The first convex portions 11A in the first unit KU extend along the first m axis Sa1 to form an elongated shape in the first rhombic region Ar1 as one of three regions obtained by evenly dividing the regular hexagon virtually formed. The first convex portions 11A are arranged in parallel at equal intervals such that one ends of the four first convex portions and other ends thereof are aligned along the second m axis Sa2.

That is, the first convex portions 11A extend in parallel to a pair of opposed sides of the rhombic region as the first region Ar1, and arranged at equal intervals along the other pair of opposed sides thereof. The first convex portions 11A disposed in the first region Ar1 are arranged such that the extending direction thereof forms 60 degrees with respect to the extending directions of the convex portions 11B and 11C provided in the second and third regions Ar2 and Ar3, which are two other rhombic regions adjacent to the first region.

The four first convex portions 11A are collectively regarded as the first sub-unit SU1, and arranged in the first region Ar1 while being spaced by a first distance da1 and a fourth distance ds1. In the first sub-unit SU1, the first convex portions 11A are arranged such that their ends on one side are aligned along one side of the regular hexagon, while their other ends on the other side are spaced from the second region Ar2 side by the first distance da1 set as a predetermined distance, and aligned along the same second m axis Sa2. Note that the fourth distance ds1 is a distance between the first convex portion 11A positioned the farthest from the central point side of the virtual regular hexagon and the corresponding one side of the regular hexagon in the first region Ar1. Here, the fourth distance ds1 is set substantially the same as that between the adjacent first convex portions 11A.

Thus, as shown in FIG. 4A, the first distance da1 between the other ends of the first convex portions 11A and the second region Ar2 is configured to be uniform across the four first convex portions 11A. A region of the substrate for continuously keeping the first distance da1 in the substantially constant range along the second m axis Sa2 is formed to overcome the third convex portion 11C located closest to the center of the regular hexagon in the third region Ar3 and to reach the third convex portion 11C located second closest to the center. In particular, in the first region Ar1, the first convex portion 11A closest to the center of the regular hexagon is spaced apart from the end of the second convex portion 11B closest to the center thereof so as not to intersect a tangent line Ya2 directed toward the first region Ar1, in parallel to the third m axis Sa3. In the center of the unit, a region continuously extending along the second m axis Sa2 can be formed from the first region Ar1 to the third region Ar3 with the first distance da1 kept constant. The tangent line Ya2 is a virtual line that is in parallel to the third m axis Sa3 and in contact with the end of the second convex portion 11B.

The second convex portions 11B in the first unit KU extend along the second m axis Sa2 to form an elongated shape in the second rhombic region Ar2 as one of three regions obtained by evenly dividing the regular hexagon virtually formed. The second convex portions 11B are arranged in parallel at equal intervals such that one ends of the four second convex portions and other ends thereof are aligned along the third m axis Sa3.

That is, the second convex portions 11B extend in parallel to a pair of opposed sides of the rhombic region as the second region Ar2, and arranged at equal intervals along the other pair of opposed sides thereof. The second convex portions 11B disposed in the second region Ar2 are arranged such that the extending direction thereof forms 60 degrees with respect to the extending directions of the convex portions 11A and 11C provided in the first and third regions Ar1 and Ar3, which are two other rhombic regions adjacent to the second region.

The four second convex portions 11B are collectively regarded as the second sub-unit SU2, and arranged in the second region Ar2 while being spaced by a second distance da2 and a fifth distance ds2. In the second sub-unit SU2, the second convex portions 11B are arranged such that their ends on one side are aligned along one side of the regular hexagon, while their other ends on the other side are spaced from the third region Ar3 side by the predetermined distance and aligned along the same third m axis Sa3. Note that the fifth distance ds2 is a distance between the second convex portion 11B positioned farthest from the central point side of the virtual regular hexagon and the corresponding one side of the regular hexagon in the second region Ar2. Here, the fifth distance ds2 is set substantially the same as the interval between the adjacent second convex portions 11B.

Thus, as shown in FIG. 4A, the second distance da2 between the other ends of the second convex portions 11B and the third region Ar3 is configured to be uniform across the four second convex portions 11B. A region of the substrate for continuously keeping the second distance da2 in the substantially constant range along the third m axis Sa3 is formed to overcome the first convex portion 11A located closest to the center of the regular hexagon in the first region Ar1 and to reach the first convex portion 11A located second closest to the center. In particular, in the second region Ar2, the second convex portion 11B closest to the center of the regular hexagon is spaced apart from the end of the third convex portion 11C closest to the center thereof so as not to intersect a tangent line Ya3 directed toward the second region Ar2, in parallel to the first m axis Sa1. Thus, in the center of the unit, the region continuously extending along the third m axis Sa3 can be formed from the second region Ar2 to the first region Ar1 with the second distance da2 kept constant. The tangent line Ya3 is a virtual line that is in parallel to the first m axis Sa1 and in contact with the end of the third convex portion 11C.

The third convex portions 11C in the first unit KU extend along the third m axis Sa3 to form an elongated shape in the third rhombic region Ar3 as one of three regions obtained by evenly dividing the regular hexagon virtually formed. The third convex portions 11C are arranged in parallel at equal intervals such that one ends of the four third convex portions and other ends thereof are aligned along the first m axis Sa1.

That is, the third convex portions 11C extend in parallel to a pair of opposed sides of the rhombic region as the third region Ar3, and arranged at equal intervals along the other pair of opposed sides thereof. The third convex portions 11C disposed in the third region Ar3 are arranged such that the extending direction thereof forms 60 degrees with respect to the extending directions of the convex portions 11A and 11B provided in the first and second regions Ar1 and Ar2, which are two other rhombic regions adjacent to the third region.

The four third convex portions 11C are collectively regarded as the third sub-unit SU3, and arranged in the third region Ar3 while being spaced by a third distance da3 and a sixth distance ds3. In the third sub-unit SU3, the third convex portions 11C are arranged such that their ends on one side are aligned along one side of the regular hexagon, while their other ends on the other side are spaced from the first region Ar1 side by the predetermined distance and aligned along the same first m axis Sa1. Note that the sixth distance ds3 is a distance between the third convex portion 11C positioned farthest from the central point side of the virtual regular hexagon and the corresponding one side of the regular hexagon in the third region Ar3. Here, the sixth distance ds3 is set substantially the same as that between the adjacent third convex portions 11C.

Thus, as shown in FIG. 4A, the third distance da3 between the other ends of the third convex portions 11C and the first region Ar1 is configured to be uniform across the four third convex portions 11C. A region of the substrate for continuously keeping the third distance da3 in the substantially constant range along the first m axis Sa1 is formed to overcome the second convex portion 11B located closest to the center of the regular hexagon in the second region Ar2 and to reach the second convex portion 11B located second closest to the center. In particular, in the third region Ar3, the third convex portion 11C closest to the center of the regular hexagon is spaced apart from the end of the first convex portion 11A closest to the center thereof so as not to intersect a tangent line Ya1 directed toward the third region Ar3, in parallel to the second m axis Sa2. Thus, in the center of the unit, the region continuously extending along the first m axis Sa1 can be formed from the third region Ar3 to the second region Ar2 with the third distance da3 kept constant. The tangent line Ya1 is a virtual line that is in parallel to the second m axis Sa2 and in contact with the end of the first convex portion 11A.

In the first unit KU and the second unit TU, at least two of the first convex portion 11A, second convex portion 11B, and third convex portion 11C, which are closest to the center of the virtual regular hexagon should be arranged spaced not to intersect a corresponding one of the tangent line Ya1, tangent line Ya2, and tangent line Ya3. For example, even if the first convex portion 11A is disposed to make the first distance da1 narrow while abutting against with the tangent line Ya2, the second convex portion 11B and the third convex portion 11C should be arranged spaced from the tangent line Ya1 or the tangent line Ya3. The same goes for the second convex portion 11B and the third convex portion 11C.

That is, in the first unit KU and the second unit TU, the first convex portion 11A located closest to the center of the regular hexagon is disposed not to intersect the tangent line Ya2 that is in parallel to the third m axis Sa3 in contact with the end on the center side of the second convex portion 11B closest to the center. Further, in the first unit KU and the second unit TU, the second convex portion 11B located closest to the center of the regular hexagon is disposed not to intersect the tangent line Ya3 that is in parallel to the first m axis Sa1 and in contact with the end on the center side of the third convex portion 11C closest to the center.

Figure 6:
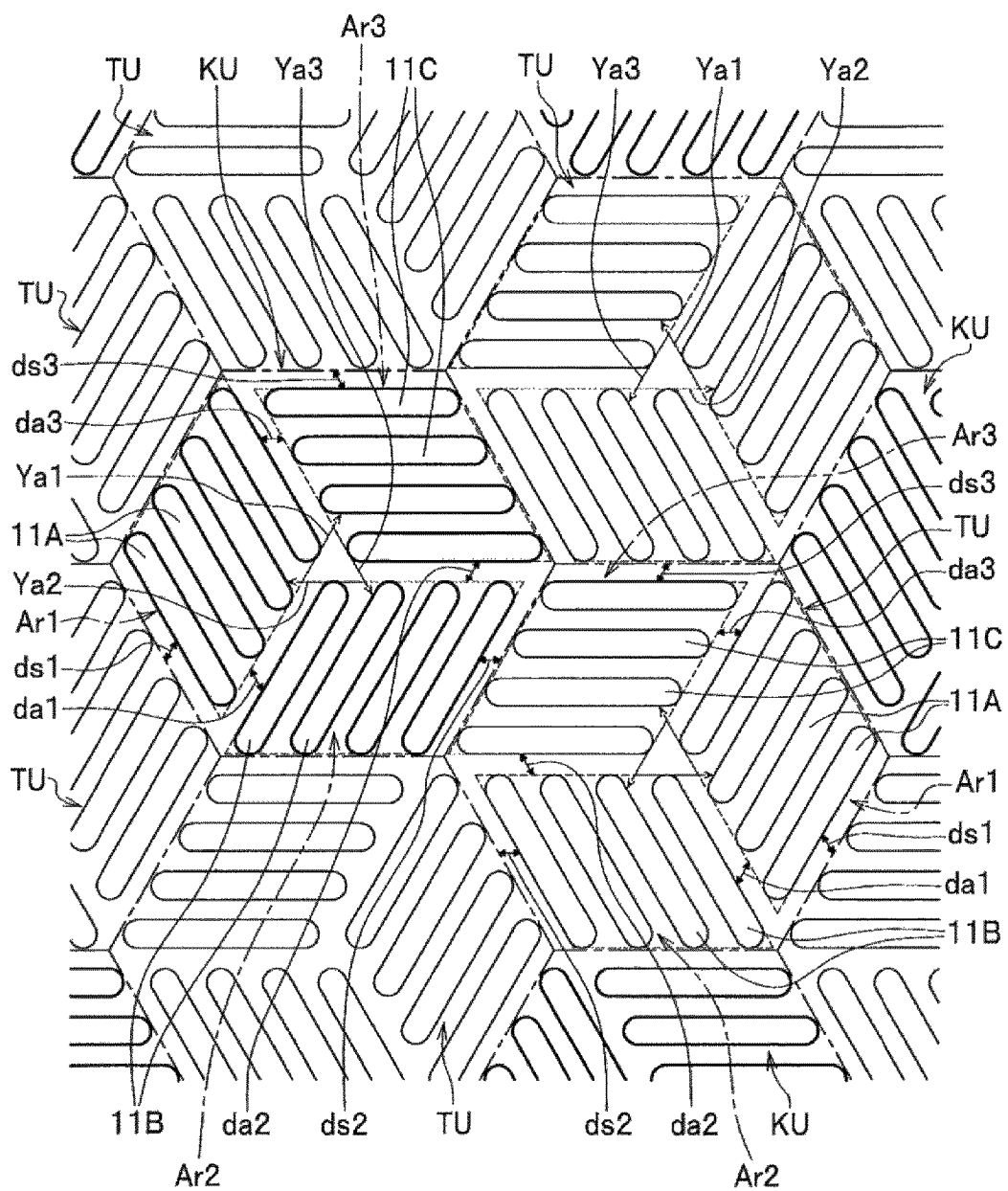
FIG. 6 is a plan view for explaining the relationship among the first unit, the second unit, and respective distances between the convex portions formed at the substrate of the light-emitting element in the first embodiment.
Figure 7:
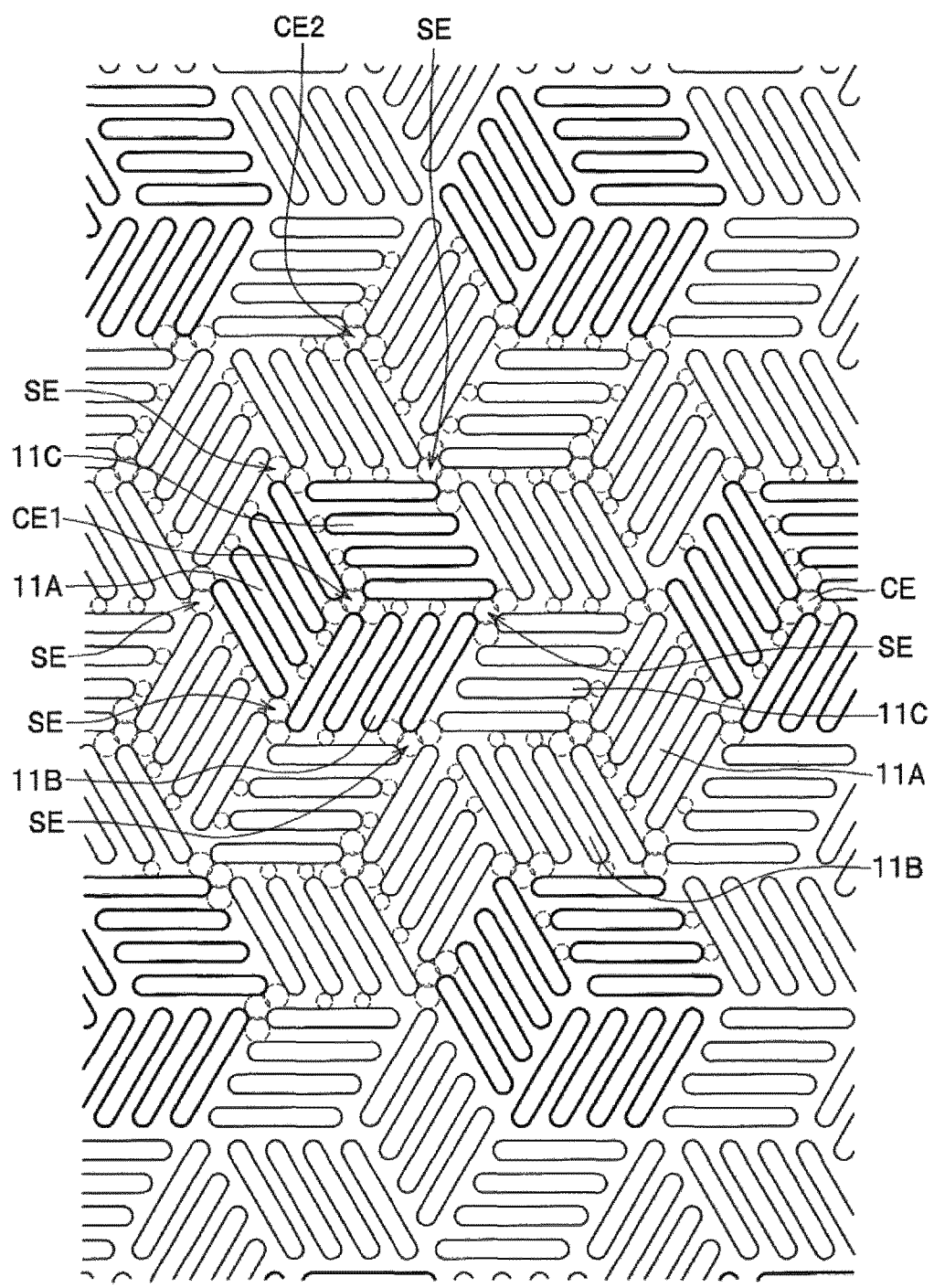
FIG. 7 is a plan view for explaining a distance between the convex portions located in the first and second units at the substrate of the light-emitting element, as well as a distance between sub-units in the first embodiment.

As shown in FIGS. 6 and 7, in the first unit KU and the second unit TU, the first convex portions 11A are arranged spaced by the first distance da1 and the fourth distance ds1 in the first region Ar1; the second convex portions 11B are arranged spaced by the second distance da2 and the fifth distance ds2 in the second region Ar2; and the third convex portions 11C are arranged spaced by the third distance da3 and the sixth distance ds3 in the third region Ar3. Thus, the first convex portions 11A to the third convex portions 11C are arranged at substantially equal intervals present in each unit pattern.

As shown in FIG. 7, the first unit KU and the second unit TU are configured such that the intervals between the convex portions 11 are substantially equal in the center regions CE1 and CE2 of the virtual regular hexagon, as well as in the respective regions SE between the apexes of the virtual regular hexagons by revising an interval between the convex portions significantly different from those in other regions.

Therefore, the first unit KU and the second unit TU have such a unit pattern that the crystal growth rate of the nitride semiconductor, such as GaN, is equalized in a plane of the sapphire substrate 10, compared to the conventional structure (in other words, the dislocation density of the nitride semiconductor layer 30 being grown tends to be reduced, and the crystal orientation of the nitride semiconductor layer 30 is improved).

In the arrangement pattern of the convex portions 11, there are six apex-parts where the first and second units KU and TU are opposed to each other. Regarding the above-mentioned sub-unit or the unit of regions, in some of the six apex-parts where the units are opposed to each other, the facing apexes of the four virtual rhombic sub-units are butted against one another, while in the others of the six apex-parts, the facing apexes of the five virtual rhombic sub-units are butted against one another. In the center of the unit, the facing apexes of the three virtual rhombic sub-units are butted against one another (in the conventional structure, for example, see FIG. 10A; in FIG. 10A, there are only two types of apex butting parts, specifically, the butting part of six apexes, and the butting part of three apexes). That is, by the use of such a unit pattern in the first unit KU and the second unit TU, the number of apexes butted against one another is set to differ depending on the positions of the virtual apexes for each sub-unit or in units of region, which can easily adjust the intervals of the convex portions 11.

As shown in FIGS. 5A to 5C, the first convex portion 11A to the third convex portion 11C has a cross-sectional shape in the transverse direction that has its upper part sharpened and not flat, so that the number of penetration dislocations appearing at the surface of the nitride semiconductor can be decreased. Note that if the convex portion 11 has the cross-sectional shape with a flat top surface, such as a trapezoid shape (not shown), the nitride semiconductor also grows from the flat top surface (c-plane). Since the nitride semiconductor growing from the top surface barely grows in the lateral direction, a plurality of dislocations generated in the growth direction does not converge, resulting in an increase in dislocation density at the surface of the nitride semiconductor. In contrast, as mentioned above, when there is no flat top surface in the cross-sectional shape of the convex portion 11, the growth from the top part of the convex portion 11 is suppressed, permitting the nitride semiconductor to grow in the lateral direction. Thus, the convex portions 11 allows the plurality of dislocations generated in the growth direction to converge, reducing the dislocation density.

In the crystal growth, a relatively stable crystal plane tends to appear as the facet surface. Crystals of the hexagonal nitride semiconductor (e.g., GaN) grows while setting a plane slightly inclined relative to the m-plane of the nitride semiconductor as the facet surface. Thus, if the tip end in the longitudinal direction of the convex portion 11 has a semi-circular shape in the planer view, the respective facet surfaces can grow substantially in the uniform width, so that the crystals of the nitride semiconductor can be butted against and bonded to each other toward the center of the semicircular shape. In the crystal growth of the nitride semiconductor, the nitride semiconductor grows mainly from the c-plane (flat surface without having the convex portions 11) of the sapphire substrate 10, whereby the crystals can be uniformly grown also in the lateral direction to be abutted against and bonded to each other above the convex portion 11 (note that referring to FIGS. 8A and 8B, the detailed description of dislocations will be given later.)

Returning to FIG. 1, the description of the structure of the light-emitting element 1 will be continued. The buffer layer 20 serves to buffer a difference in lattice constant between the sapphire substrate 10 and the nitride semiconductor grown on the sapphire substrate 10. The buffer layer 20 is formed between the sapphire substrate 10 and the nitride semiconductor layer 30. The buffer layer 20 includes, for example, AlN, AlGaN, etc. The buffer layer 20 can be formed by sputtering, for example, under predetermined conditions in a buffer layer formation step of the manufacturing method as mentioned later. The buffer layer 20 is a layered shape that covers the sapphire substrate 10, for example, as shown in FIG. 1, but may partly expose the sapphire substrate 10.

The nitride semiconductor layer 30 serves as a light emission portion of the light-emitting element 1 and is formed using a nitride semiconductor, such as $In_XAl_YGa_{1-X-Y}N$ (0≤X, 0≤Y, X+Y≤1). As illustrated in FIG. 1, the nitride semiconductor layer 30 is formed over the c-plane (main surface) of the sapphire substrate 10 via the buffer layer 20, and has a laminated structure including an n-type semiconductor layer 31, an active layer 32, and a p-type semiconductor layer 33 that are stacked from the bottom in this order. The active layer 32 has a quantum well structure, for example, with a well layer (light-emission layer) and a barrier layer.

Figure 8A:
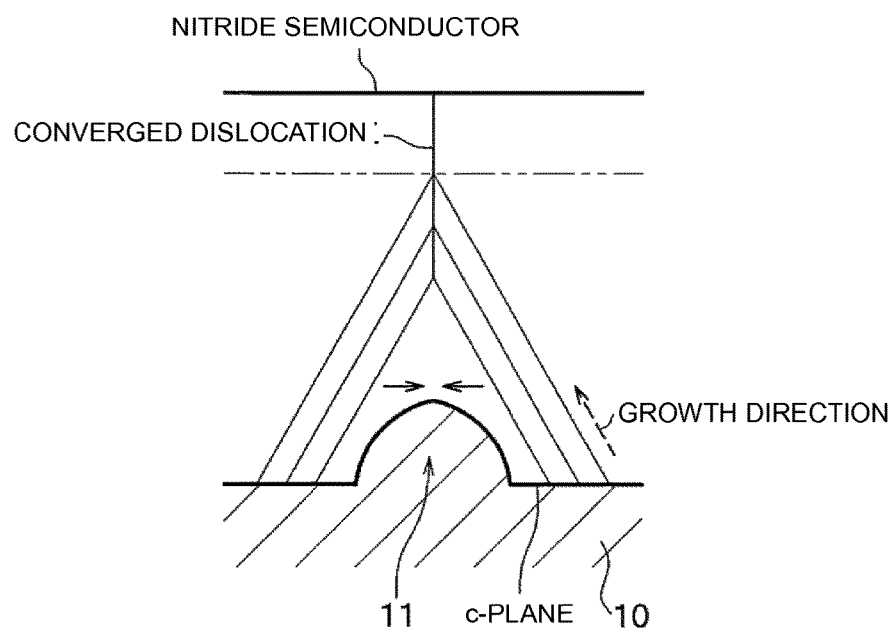
FIG. 8A is an explanatory diagram schematically showing a cross-sectional resultant state of a crystal growth direction of a nitride semiconductor and converging dislocations thereof at the light-emitting element in the first embodiment.
Figure 8B:
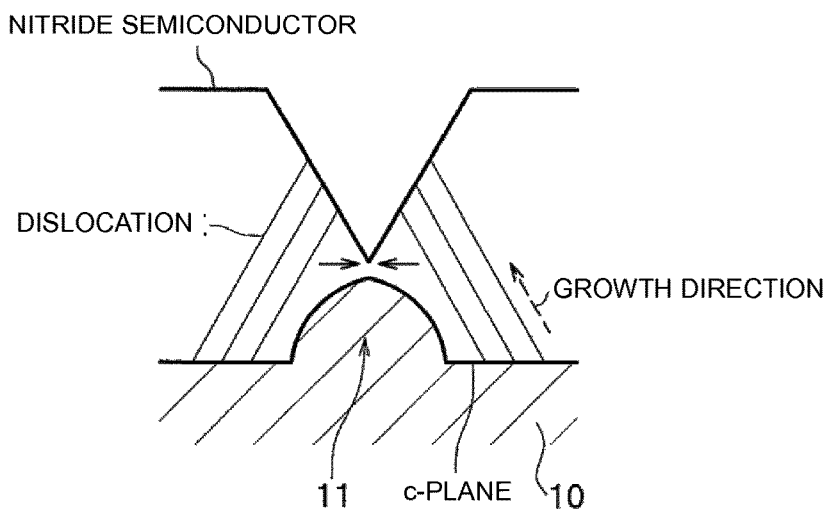
FIG. 8B is an explanatory diagram schematically showing another cross-sectional midway state of a crystal growth direction of the nitride semiconductor and converging dislocations thereof at the light-emitting element in the first embodiment.

Here, referring to FIGS. 8A and 8B, the crystal growth and dislocation will be described. In the use of a flat sapphire substrate 10 with no convex portions 11 formed thereon, crystals of the nitride semiconductor cannot grow in the lateral direction. However, as mentioned above, in the use of the above-mentioned sapphire substrate 10 with the convex portions 11 formed thereon, crystals of the nitride semiconductor can also grow in the lateral direction during the crystal growth. Since dislocations basically proceed in the crystal growth direction, as shown in FIGS. 8A and 8B, the nitride semiconductor grows in the lateral direction toward the convex portion 11, whereby the dislocations of the nitride semiconductor also proceed in the lateral direction toward above the convex portion 11. Above the convex portion 11, the nitride semiconductors are butted against each other, also causing convergence of the dislocations to make a closed loop or the like. As a result, the dislocations are less likely to appear on the surface of the final surface of the nitride semiconductor. Note that in FIGS. 8A and 8B, the crystal growth proceeds from the state shown in FIG. 8B to that shown in FIG. 8A over time.

In this way, the crystals of the nitride semiconductor are gradually butted against and bonded to each other with the facet surface kept exposed, which decreases the number of dislocations, leading to a decrease in dislocation density of the nitride semiconductor layer 30. At this time, as illustrated by the change from the state of FIG. 8B to that of FIG. 8A, the longer the time during which the nitride semiconductor exposes the facet surface (the thicker the grown layer with the facet surface exposed), the more likely the dislocations are to converge, which can easily decrease the number of dislocations. By configuring the unit pattern of the convex portions 11 as mentioned above, the dislocations can converge in a shorter time, thus enabling the crystal growth to achieve a flat surface in a position closer to the sapphire substrate 10, compared to the case in the related art. As shown in FIGS. 8A and 8B, the proceeding direction of dislocations during the crystal grow in the lateral direction is one direction, but can change in midstream. For example, the dislocations proceed upward in the early stage, and then laterally or obliquely upward in the midstream.

The convex portion 11 has its outer edge in the longitudinal direction shaped to extend in the direction forming an angle along the corresponding one of the first m axis Sa1 to the third m axis Sa3 of the sapphire substrate 10, so that the crystal growth rate is adjusted until the crystals of the nitride semiconductor are butted against and bonded to each other above the convex portion 11 to achieve the flat surface in a short time. Now, a description will be given of GaN by way of example, which is one of typical nitride semiconductors.

Crystals of the hexagonal GaN grow with the upward direction set as the c-axis direction. Regarding the lateral direction, crystals are less likely to grow in the m-axis direction, compared to the a-axis direction. Thus, crystals tend to grow while maintaining the facet surface having its base aligned with the line of intersection between the c-plane of the sapphire substrate 10 and a surface equivalent to the m-plane of the GaN (surface perpendicular to the c-plane of the sapphire substrate 10) in the plan view. At this time, the m-plane of GaN is positioned along the same flat surface as the a-plane of the sapphire substrate 10. That is, GaN tends to grow while maintaining the facet surface which has, as its base, the line aligned with the a-plane of the sapphire substrate 10 in the plan view. Then, the elongated convex portions 11 having the outer edges extending in the longitudinal direction are arranged at the surface of the sapphire substrate 10 along a surface different from the m-plane of the sapphire substrate 10 (typically, a-plane). Thus, the outer edge extending in the longitudinal direction of the convex portion 11 is not aligned with the a-plane of GaN, and the base of the facet surface is in parallel to the outer edge extending in the longitudinal direction of the convex portion 11.

As a result, as compared to the case in which the outer edge of the convex portion 11 extending in the longitudinal direction is aligned with the a-plane of the GaN, that is, the case in which the base of the facet surface is non-parallel with respect to the outer edge extending in the longitudinal direction of the convex portion 11, the growth rate of GaN in the transverse direction of the convex portion 11 becomes slow. Thus, above the convex portion 11, it takes more time to grow crystals in the lateral direction than to grow crystals in the upward direction, and dislocations are easily permitted to converge, which can reduce the dislocation density. When the direction in which the nitride semiconductor easily grows (a-axis direction of GaN) is identical to the transverse direction of the convex portion 11, the crystals of the nitride semiconductor growing from both sides in the transverse direction of the convex portion 11 are butted against and bonded to each other across a wide range. When the grown crystals are butted against each other, new dislocations might occur. For this reason, the transverse direction of the convex portions 11 are positioned to be displaced from the a-axis direction of GaN in which the nitride semiconductor tends to easily grow (here, the longitudinal direction of the convex portion 11 of the sapphires substrate 10 is disposed along each of the m axes of the sapphire substrate 10), so that the crystals of the nitride semiconductor grown from both sides in the longitudinal direction of the convex portion 11 are butted against and bonded to each other, thereby suppressing occurrence of new dislocations.

In the light-emitting element 1, as mentioned above, the facet surface of the nitride semiconductor is aligned with the outer edge of the convex portion 11 extending in the longitudinal direction, whereby crystals of the nitride semiconductor gradually grow from the vicinity of their tip ends to converge near the center of the convex portion 11. Thus, in the plan view, above the convex portion 11, an area at the center of the convex portion 11 in the longitudinal direction where the dislocations remain becomes small (narrow) and further the dislocation density also tends to be small. In contrast, for example, when the outer edge extending in the longitudinal direction of the convex portion 11 is positioned in the direction exceeding a range of ±10° from each m axis of the sapphire substrate 10 (for example, when the longitudinal direction of the convex portion is aligned with a direction perpendicular to the direction of the first m axis Sa1), the outer edges extending in the longitudinal direction of the convex portion 11 are not aligned with the facet surface of the nitride semiconductor. As a result, the crystals of the nitride semiconductor are almost simultaneously butted against and bonded to each other in the vicinity of the center line of the convex portion 11 in the longitudinal direction, and will not be able to grow in the lateral direction any more.

By using such a unit pattern in the first unit KU and the second unit TU, a difference in growth rate of the nitride semiconductor in the plane of the sapphire substrate 10 can be reduced (the flatness of the nitride semiconductor can be improved during the crystal growth), thereby further decreasing the dislocation density of the nitride semiconductor layer 30, compared to the case in which an interval between adjacent convex portions 11 in the first unit KU and the second unit TU is narrow. Together with this, the crystal growth of the nitride semiconductor layer 30 can also be improved. For example, if an interval at the center of the unit cannot be adjusted, even though an interval between the units is secured, the further flatness during the crystal growth cannot be ensured. The unit pattern is formed by positioning the second unit TU having the mirror symmetry relative to the first unit KU to widen the arrangement of the center of the unit (with a space in the ±m axis direction of the sapphire substrate), thereby ensuring further flatness.

The light-emitting element 1 with the above-mentioned structure in the first embodiment includes the nitride semiconductor layer 30 with the low dislocation density that is grown from the sapphire substrate 10 with the elongated convex portions 11, and thus can improve the temperature property. The term "improvement of the temperature property" as used herein means that a change in output is small when the atmospheric temperature is increased. For example, assuming that an optical output from the light-emitting element 1 is set to 1 while being driven under the normal-temperature atmosphere (for example, at 25° C.), the optical output from the light emitting element 1 while being driven under the high-temperature atmosphere (for example, at 100° C.) is decreased to become lower than 1, but this decrease of the optical output is small.

Such improvement of the temperature property is supposed to be due to reduction in trapped electrons caused by the dislocations because the dislocation density is decreased. In more details, the dislocation density of, particularly, the active layer 32 of the nitride semiconductor layer 30 is lowered to thereby improve the temperature property. The dislocation density of the active layer 32 can be determined by the density of dislocations appearing at the surface of the n-type semiconductor layer 31 as the underlayer. Thus, especially, the dislocation density of the surface of the n-type semiconductor layer 31 is preferably decreased.

Normally, in light-emitting elements, as the dislocation density is decreased, the temperature property is improved, but Vf is increased, and the optical output is lowered (that is, the forward voltage (Vf) and the optical output (Po) are degraded.) However, the light-emitting element 1 with the structure of the present disclosure can also improve the crystal orientation, thereby reducing the forward voltage (Vf) while maintaining or improving the temperature property, thus improving the optical output (Po). Together with this, the light-emitting element 1 can also improve its luminous efficiency.

[Manufacturing Method for Light-Emitting Element]

A manufacturing method for the light-emitting element 1 in the first embodiment will be described with reference to FIGS. 9A to 9I. Note that a description will be given of the manufacturing method for a light-emitting element 2, in which an external connection electrode is added to the light-emitting element 1. The cross-sectional views of the substrate illustrate sections taken along the longitudinal direction through the center of the third convex portion located closest to the center point of the first unit KU.

First, the manner of forming the convex portion 11 on the main surface of the sapphire substrate will be described. The convex portion 11 is formed at the sapphire substrate by performing a mask formation step shown in FIG. 9A, and an etching step shown in FIGS. 9B and 9C in this order.

Figure 9A:
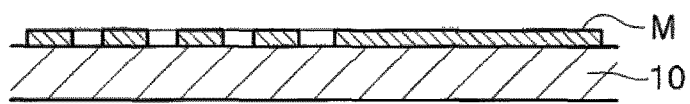
FIG. 9A is a schematic cross-sectional view showing the state of a mask formation step while omitting illustration of a part of the sapphire substrate in order to form the convex portions at the substrate of the light-emitting element in the first embodiment.

In the mask formation step, a mask M is formed on the sapphire substrate 10. In the mask formation step, specifically, as shown in FIG. 9A, for example, $SiO_2$ or photoresist is deposited at the surface on the c-plane side of the sapphire substrate 10 and then patterned, thereby forming a plurality of elongated masks M that cover regions where the convex portions 11 are to be formed.

Figure 9B:
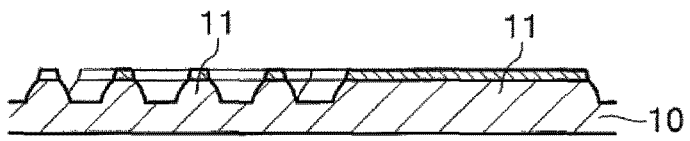
FIG. 9B is a schematic cross-sectional view showing a midstream of an etching step while omitting illustration of a part of the substrate in order to form the convex portions at the sapphire substrate of the light-emitting element in the first embodiment.
Figure 9C:
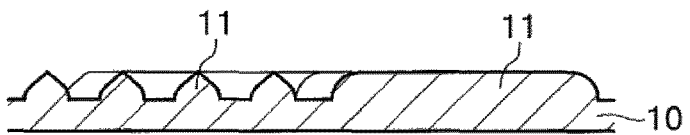
FIG. 9C is a schematic cross-sectional view showing the end of the dry etching in the etching step while omitting illustration of a part of the substrate in order to form convex portions at the sapphire substrate of the light-emitting element in the first embodiment.

The etching step involves etching the sapphire substrate 10. In the etching step, specifically, as shown in FIGS. 9B and 9C, the sapphire substrate 10 with the mask M disposed therein is dry-etched to thereby form a plurality of convex portions 11 inside the first unit KU and the second unit TU having virtual regular hexagonal shape, at the surface on the c-plane side of the sapphire substrate 10. Each of the convex portions 11 has an elongated shape that extends along a corresponding one of the first m axis Sa1, the second m axis Sa2, and the third m axis Sa3.

In this embodiment, material that is less susceptible to etching than the substrate is used as material for the mask M, whereby in a first etching step, the mask M on the sapphire substrate 10 is also etched. In this case, not only the upper surface but also the side surfaces of the mask M are gradually etched to reduce the diameter of the mask M. The top part of convex portion 11 over the sapphire substrate 10 is etched into a domical shape, such as a semicircular shape, with its upper end sharpened, in the front view. If the convex portion 11 has its upper surface (c-plane) formed in some shape, the nitride semiconductor might grow from the upper surface. For this reason, the upper end of the convex portion with no upper surface, such as in a hemispherical shape, is preferably formed in a sharpened shape.

Specific ways for the dry etching suitable for use can include, for example, vapor-phase etching, plasma etching, and reactive ion etching. At this time, examples of etching gas include $Cl_2$, $SiCl_4$, $BCl_3$, HBr, $SF_6$, $CH_4$, $CH_2F_2$, $CHF_3$, $C_4F_8$, $CF_4$, and Ar of inert gas.

A manufacturing method for the light-emitting element 1 will be described below.

Figure 9D:
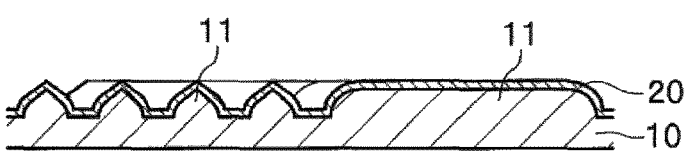
FIG. 9D is a schematic diagram showing a manufacturing process of the light-emitting element in the first embodiment, specifically, a schematic cross-sectional view of the state of a buffer layer formed in a buffer layer formation step while omitting illustration of a part of the substrate.
Figure 9E:
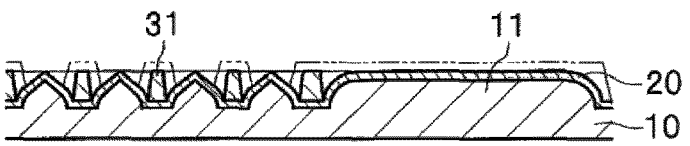
FIG. 9E is a schematic diagram showing another manufacturing process of the light-emitting element in the first embodiment, specifically, a schematic cross-sectional view of a midstream of a semiconductor growth step while omitting illustration of a part of the substrate.
Figure 9F:
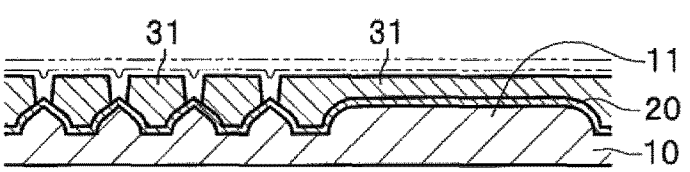
FIG. 9F is a schematic diagram showing another manufacturing process of the light-emitting element in the first embodiment, specifically, a schematic cross-sectional view of another midstream of the semiconductor growth step while omitting illustration of a part of the substrate.

In the manufacturing method for the light-emitting element 1, after forming the convex portions 11 (first convex portion 11A to third convex portion 11C) at the sapphire substrate 10 mentioned above, further, a buffer layer formation step shown in FIG. 9D and a semiconductor layer growth step shown in FIGS. 9E and 9F are performed in this order.

In the buffer layer formation step, the buffer layer 20 is formed over the sapphire substrate 10. Specifically, as shown in FIG. 9D, the buffer layer formation step involves forming the buffer layer 20, for example, by sputtering, over the sapphire substrate 10 with the convex portions 11 formed thereat. The buffer layer formation step can also be omitted, but should be preferably performed. For example, as shown in FIG. 9D, the buffer layer 20 has a layered shape that covers the sapphire substrate 10, but does not necessarily cover the sapphire substrate completely in the layered shape and may partially expose the sapphire substrate 10 in a patchy manner by decreasing the layer thickness.

In the semiconductor layer growth step, the nitride semiconductor layer 30 is grown over the surface of the sapphire substrate 10 on the side with the convex portions 11 formed, thereby forming a light-emitting element structure. Specifically, in the semiconductor layer growth step, as shown in FIGS. 9E to 9F, crystals for the n-type semiconductor layer 31 are grown over the surface on the c-plane side of the sapphire substrate 10 with the convex portions 11 via the buffer layer 20. At this time, the n-type semiconductor layer 31 grows in the upward direction and lateral direction from an area between the convex portions 11 to cover the convex portions 11. Until the convex portions 11 are completely covered, the nitride semiconductor included in the n-type semiconductor layer 31 grows over the surface of the sapphire substrate 10 while maintaining an inclined growth surface (facet surface). When the n-type semiconductor layer 31 grows, the dislocations converge as already mentioned with reference to FIGS. 8A and 8B, whereby the dislocations can be reduced, compared to the related art structure.

Figure 9G:
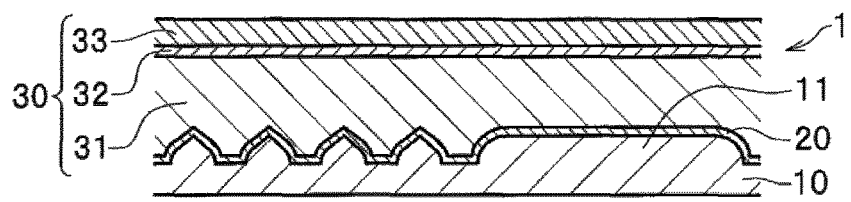
FIG. 9G is a schematic diagram showing another manufacturing process of the light-emitting element in the first embodiment, specifically, a schematic cross-sectional view of the state of a semiconductor layer provided in the semiconductor layer growth step while omitting illustration of a part of the substrate.

Subsequently, as shown in FIG. 9G, the active layer 32 is grown on the n-type semiconductor layer 31, and further the p-type semiconductor layer 33 is formed thereon, thereby forming the light-emitting element structure including the active layer 32. Note that until the crystals of the nitride semiconductor are bonded together above the convex portion 11, an non-doped nitride semiconductor layer with no impurities added may be grown, and then n-type impurities may be added to grow the n-type nitride semiconductor layer. At least until the crystals of the nitride semiconductor may be bonded together above the convex portions 11, more preferably, the nitride semiconductor made of GaN continues to be grown.

Through the steps mentioned above, as shown in FIG. 9G, the light-emitting element 1 with no electrode can be manufactured.

Figure 9H:
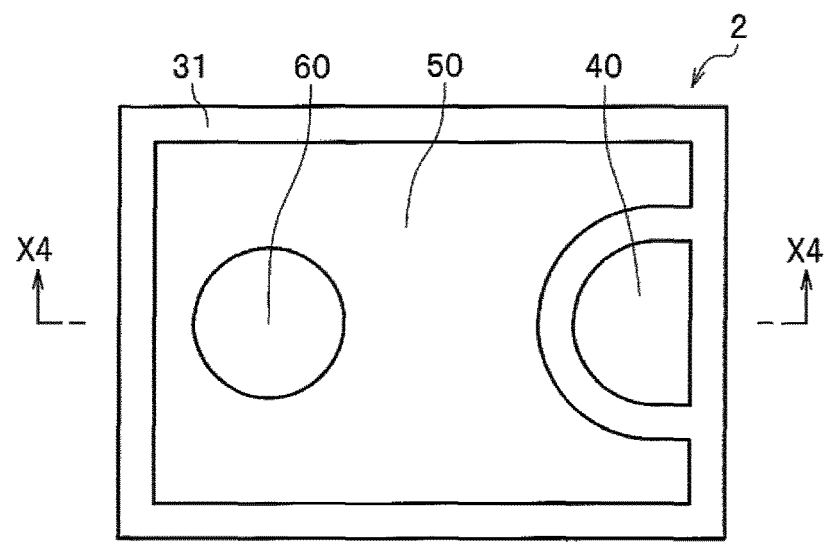
FIG. 9H is a schematic diagram showing another manufacturing process of the light-emitting element in the first embodiment, specifically, a plan view showing an example of the light-emitting element having electrodes formed after the semiconductor layer growth step.
Figure 9I:
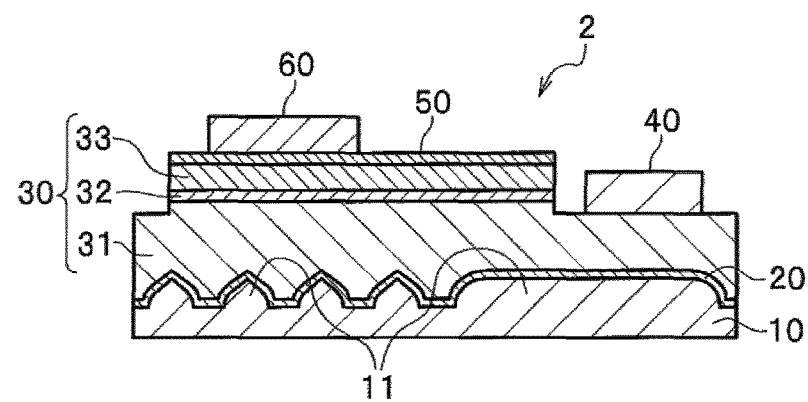
FIG. 9I is a schematic diagram showing another manufacturing process of the light-emitting element in the first embodiment, specifically, a cross-sectional view taken along the line X4-X4 of FIG. 9H showing the example of the light-emitting element having the electrodes formed after the semiconductor layer growth step.

Next, FIGS. 9H and 9I show specific examples of a manufacturing method for the light-emitting element 2 that includes the light-emitting element 1 equipped with the external connection electrode. The light-emitting element 2 shown in FIGS. 9H and 9I includes the sapphire substrate 10 with the convex portions 11, and the n-type semiconductor layer 31, the active layer 32, and p-type semiconductor layer 31 that are provided over the sapphire substrate. The n-type semiconductor layer 33 is partly exposed and provided with an n-side electrode 40. A translucent electrode (for example, ITO) and a p-side electrode 60 are provided at the surface of the p-type semiconductor layer 33. After the semiconductor layer growth step mentioned above, an electrode formation step is performed, so that the light-emitting element 2 including the light-emitting element 1 equipped with these electrodes can be manufactured.

That is, first, partial regions of the p-type semiconductor layer 33 and the active layer 32 are removed by dry etching and the like to expose a part of the n-type semiconductor layer 31. Then, the n-side electrode 40 is formed over an exposed part of the n-type semiconductor layer 31, the translucent electrode 50 is formed over the p-type semiconductor layer 33, and the p-type electrode 60 is formed over the translucent electrode 50, whereby the light-emitting element 2 can be manufactured as shown in FIGS. 9H and 9I. Note that after the above-mentioned semiconductor layer growth step, a singulation step may be performed which involves dividing the above-mentioned light-emitting element structure and the sapphire substrate 10 into singulated elements. At this time, the electrode formation step is performed after the semiconductor layer growth step and before the singulation step.

In the manufacturing method for the light-emitting element 1 in this way, the convex portions 11 formed at the sapphire substrate 10 have their top parts formed not to be flat, and extend along the respective m axes. The convex portions 11 are arranged within either the first unit KU or the second unit TU as the virtual regular hexagon and arranged at predetermined intervals in each unit. Thus, the manufacturing method for the light-emitting element 1 can reduce a difference in growth rate of the nitride semiconductor in the plane of the sapphire substrate 10 (or improve the flatness of the nitride semiconductor during the growth step), thereby decreasing the dislocation density of the nitride semiconductor layer 30. Together with this, the crystal growth of the nitride semiconductor layer 30 can be improved. Thus, the light-emitting element 1 with the structure of the present disclosure can also improve the crystal orientation, thereby reducing the forward voltage (Vf) while maintaining or improving the temperature property, thus improving the optical output (Po). Additionally, the light-emitting element 1 can also improve its luminous efficiency.

Then, the features of the substrate will be described. The description will be given of the flatness during crystal growth by comparing a unit pattern that has only a first unit KU with convex portions 11 arranged at small intervals in the center of the unit as shown in FIGS. 10A to 10D, with another unit pattern that is formed by positioning the second unit TU to have the mirror symmetry relative to the first unit KU to widen the center of the unit for arrangement as shown in FIGS. 11A to 11D. Referring to FIGS. 10A to 10D, an interval between the ends of the convex portions 1011 at the center of a PB region is narrow, leading to a state in which the region continuing in each m-axis direction is small (or a state in which the ends of the convex portions 11 overcome the tangent lines Ya1 to Ya3). Referring to FIGS. 10A to 10D, which are schematic diagrams that are made based on a scanning electron microscope (SEM) photograph, a description will be given of an example of GaN grown on the sapphire substrate with convex portions 1011 as a Comparative Example. Referring to FIGS. 11A to 11D, which are schematic diagrams that are made based on a scanning electron microscope (SEM) photograph, a description will be given of an example of GaN grown on the sapphire substrate with the elongated convex portions 11 as the first embodiment.

Each of the convex portion 11 and the convex portion 1011 had a length in the longitudinal direction of about 10 μm, a length in the transverse direction of about 2.6 μm, and a height of about 1.4 μm. The convex portion 11 and the convex portion 1011 were formed to have their outer edges in the longitudinal direction extending along one of the first m axis Sa1, the second m axis Sa2, and the third m axis Sa3 of the sapphire substrate. The thickness of the GaN was approximately 2 μm in FIGS. 10B and 11B, approximately 3.5 μm in FIGS. 10C and 11C, and approximately 4.5 μm in FIGS. 10D and 11D. Note that GaN was deposited by setting the flow rate of TMG supplied as gallium raw material gas, for example, to 20 sccm until the GaN film had a thickness of about 2 μm, and then to 60 sccm. As other process conditions, until the thickness of the deposited GaN film reached about 2 μm, the pressure was set to 1 atm, and a V/III ratio was set to about 2000, and thereafter, the pressure was set 1 atm, and a V/III ratio was set to about 1500. The sapphire substrate having +c-plane as its main surface was used. Over the main surface of the sapphire substrate, AlGaN was deposited in a thickness of about 20 nm as the buffer layer, and then GaN was deposited thereon.

By comparison between the position designated by PA and the position designated by PB in the drawing, the following is shown. That is, referring to FIGS. 10B to 10D, only the first units KU are provided with the convex portions 1011 disposed densely at the center of the unit. Thus, when the thickness of the grown crystals of GaN is 4.5 the state of crystal growth differs between the positions PA and PB. In other words, as shown in FIG. 10D, in the position PA, the crystals grow fast, thus making the crystal surface already flat, while in the position PB, the crystals grow slower than that in the position PA because of no space in ±a axis direction (±m axis direction of the sapphire substrate) of GaN, which is more likely to grow, thus making the surface of GaN still recessed.

Figure 11A:
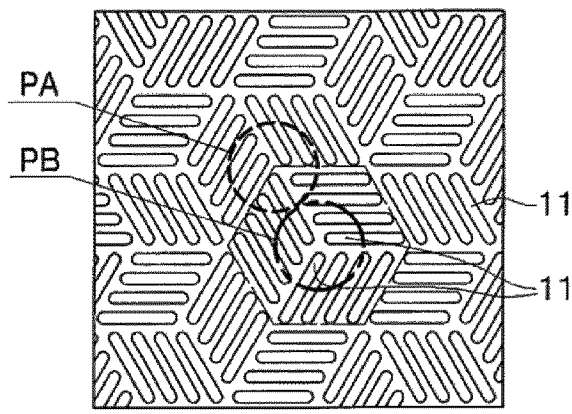
FIG. 11A is a schematic plan view showing the arrangement state of convex portions formed at a sapphire substrate in the first embodiment.
Figure 11B:
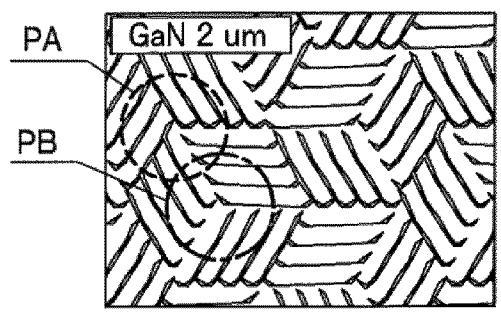
FIG. 11B is a schematic plan view showing the state of crystal growth of a nitride semiconductor layer in a thickness of 2 μm on the sapphire substrate in the first embodiment.
Figure 11C:
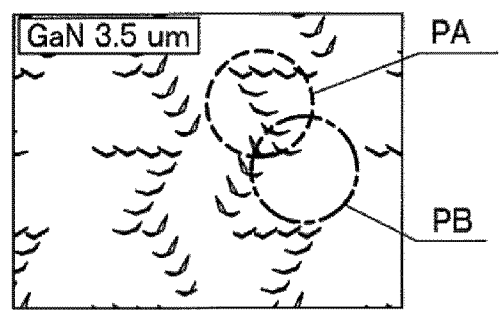
FIG. 11C is a schematic plan view showing the state of crystal growth of a nitride semiconductor layer in a thickness of 3.5 μm on the sapphire substrate in the first embodiment.
Figure 11D:
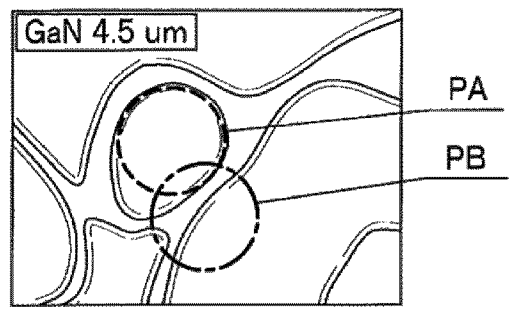
FIG. 11D is a schematic plan view showing the state of crystal growth of a nitride semiconductor layer in a thickness of 4.5 μm on the sapphire substrate in the first embodiment.

In contrast, referring to FIG. 11A, the first unit KU and the second unit TU take the specific unit pattern while the ends of the convex portions 11 at the center of the unit are spaced apart from each other (in a state where the ends of the convex portions 11 do not overcome the respective tangent lines Ya1 to Ya3). Thus, as shown in FIGS. 11B to 11D, when the thickness of the grown crystals of GaN is 4.5 the surface of the GaN becomes substantially flat in both positions PA and PB. That is, the space is formed at the center of the unit in the ±a-axis direction of GaN (in the ±m-axis direction of the sapphire substrate), and the specific unit pattern of the first unit and second unit is used, whereby the crystal growth rate becomes substantially equal across the entire substrate, thus achieving the flat structure in which GaN is grown with the uneven surface state suppressed.

Figure 10A:
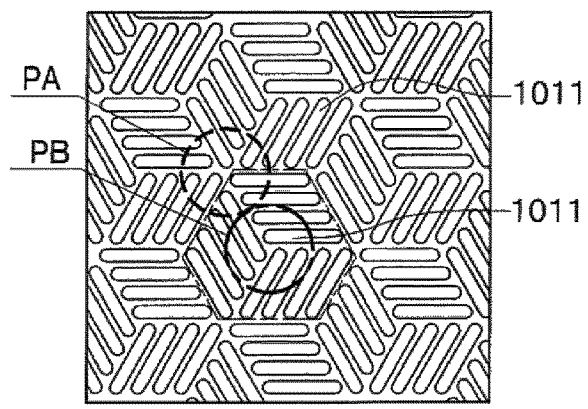
FIG. 10A is a schematic plan view showing the arrangement state of convex portions formed at a sapphire substrate in a structure of a comparative example for the first embodiment.
Figure 10B:
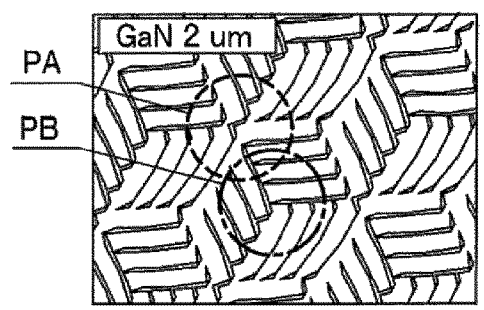
FIG. 10B is a schematic plan view showing the state of crystal growth of a nitride semiconductor layer in a thickness of 2 μm on the sapphire substrate in the structure of the comparative example for the first embodiment.

In a Comparative Example, a wafer is prepared by allowing the nitride semiconductor layer to grow on the sapphire substrate with the convex portions 11 arranged in the manner represented by PB of FIG. 10A. Further, in an Example of the invention, a wafer is prepared by allowing the nitride semiconductor layer to grow on the sapphire substrate with the convex portions 1011 arranged in the manner represented by PB of FIG. 11A. In the respective center regions of the prepared wafers in Comparative Example and Example, an full width at half maximum (FWHM) of X-ray rocking curve (XRC) at (002) surface and the number of pits caused by threading dislocations were measured. The results thereof are shown in Table 1.

Figure 10C:
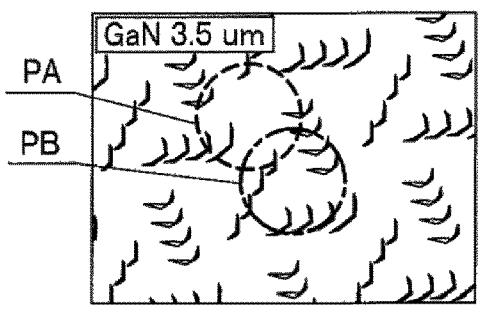
FIG. 10C is a schematic plan view showing the state of crystal growth of a nitride semiconductor layer in a thickness of 3.5 μm on the sapphire substrate in the structure of the comparative example for the first embodiment.
Figure 10D:
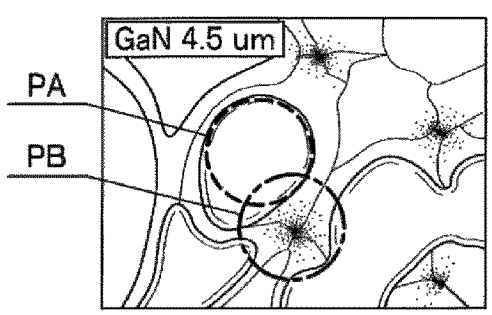
FIG. 10D is a schematic plan view showing the state of crystal growth of a nitride semiconductor layer in a thickness of 4.5 μm on the sapphire substrate in the structure of the comparative example for the first embodiment.

In each of the Comparative Example and the Example, when intended to measure the FWHM of XRC at the (002) surface, an n-type semiconductor layer, an active layer, and a p-type semiconductor layer were grown in this order over the structure shown in FIG. 10C or 11C to form a nitride semiconductor layer, and then the nitride semiconductor layer was measured for the FWHM of XRC.

When intended to measure the number of pits caused by the threading dislocations, an n-type semiconductor was grown on the structure shown in FIG. 10C or 11C to form a nitride semiconductor layer, and further GaN for measurement was grown on the nitride semiconductor layer. Then, the number of pits were measured in a range of 10 μm×10 μm from the upper surface of the nitride semiconductor layer. Note that to simply measure the dislocation density in measurement of the number of pits, the GaN was dared to be further grown on the n-type semiconductor layer under conditions in which the crystal growth in the lateral direction became slow, causing pits to occur from the dislocations as starting points, which allows an operator to view the dislocation as the pit from the upper surface of the nitride semiconductor layer.

TABLE 1

|  | FWHM of XRC at (002) surface (arcsec) | Number of pits caused by threading dislocations (pieces) |
| --- | --- | --- |
| Comparative Example | 211 | 70 |
| Example | 197 | 58 |

As shown in Table 1, it is found that the FWHM of XRC at the (002) surface in Example having the structure of the convex portions 11 shown in FIG. 11A is smaller than that in Comparative Example having the structure of the convex portions 1011 shown in FIG. 10A, and that the dislocation density in Example is smaller than that in Comparative Example based on the result of the number of pits caused by the threading dislocations.

Next, GaN was grown on the sapphire substrate having the structure of the convex portions 1101 shown in FIG. 10A as Comparative Example, and on the sapphire substrate having the structure of the convex portions 11 shown in FIG. 11A as Example to thereby form a wafer having a laminated structure of an n-type semiconductor layer, an active layer, and a p-type semiconductor layer in this order. The wafer was singulated into light-emitting elements. In the light-emitting element sampled in each of Comparative Example and Example, a forward voltage (Vf), an optical output (Po), a power conversion efficiency (WPE), and a temperature property were measured, and the results thereof are shown in Table 2. Note that the values shown in Table 2 were obtained by measurement on samples of the light-emitting elements taken from the center regions of the wafers and on which the electrodes were formed, in both Comparative Example and Example.

The temperature property was calculated based on a mathematical formula 1 below from an optical output (Po) at atmospheric temperature of 100° C. and an optical output (Po) at atmospheric temperature of 25° C. by allowing the current of 65 mA to flow through the light-emitting element. As the value of the temperature property becomes higher, the decrease in optical output is reduced relative to the change in temperature (which means the excellent temperature property).

[Equation 1]

$$\text{Temperature property } [\%] = \frac{\text{Optical output at } 100° \text{ C. } (Po)}{\text{Optical output at } 25° \text{ C. } (Po)} \times 100 \quad \text{Formula (1)}$$

TABLE 2

|  | Forward voltage Vf (V) | Optical output Po (mW) | Power conversion efficiency WPE (%) | Temperature property (%) |
| --- | --- | --- | --- | --- |
| Comparative Example | 2.93 | 133.5 | 70.0 | 90.6 |
| Example | 2.90 | 134.1 | 71.2 | 91.7 |

As shown in Table 2, it is found that the light-emitting element structure in Example having the convex portions 11 shown in FIG. 11A has a smaller forward voltage (Vf), a larger optical output (Po), a higher power conversion efficiency (WPE), and a larger temperature property than those of the light-emitting element in Comparative Example having the convex portions 1011 shown in FIG. 10A. That is, the light-emitting element 1 with the structure of the present disclosure can also improve the crystal orientation, thereby reducing the forward voltage (Vf) while maintaining or improving the temperature property, and improving the optical output (Po). Together with this, the light-emitting element 1 can also improve its luminous efficiency.

While the light-emitting element 1 and the manufacturing method therefor according to the first embodiment have been specifically described above, the spirit of the present disclosure is not limited to the description above and must be widely interpreted based on the description in the accompanied claims. It is apparent that various modifications and changes can be made to these descriptions and are included in the spirit of the invention.

The second to fourth embodiments and modified examples 1 to 3 will be described below with reference to FIGS. 12 to 17. Referring to FIGS. 12 to 16, differences in the arrangement structure of convex portions from those of the first embodiment will be mainly described. Light-emitting elements in the second to fourth embodiments to be described later have the substantially same structure and manufacturing method as that of the light-emitting element 1 in the first embodiment, except for the structure of the convex portions of the sapphire substrate, and a description thereof will be omitted.

Second Embodiment

Figure 12:
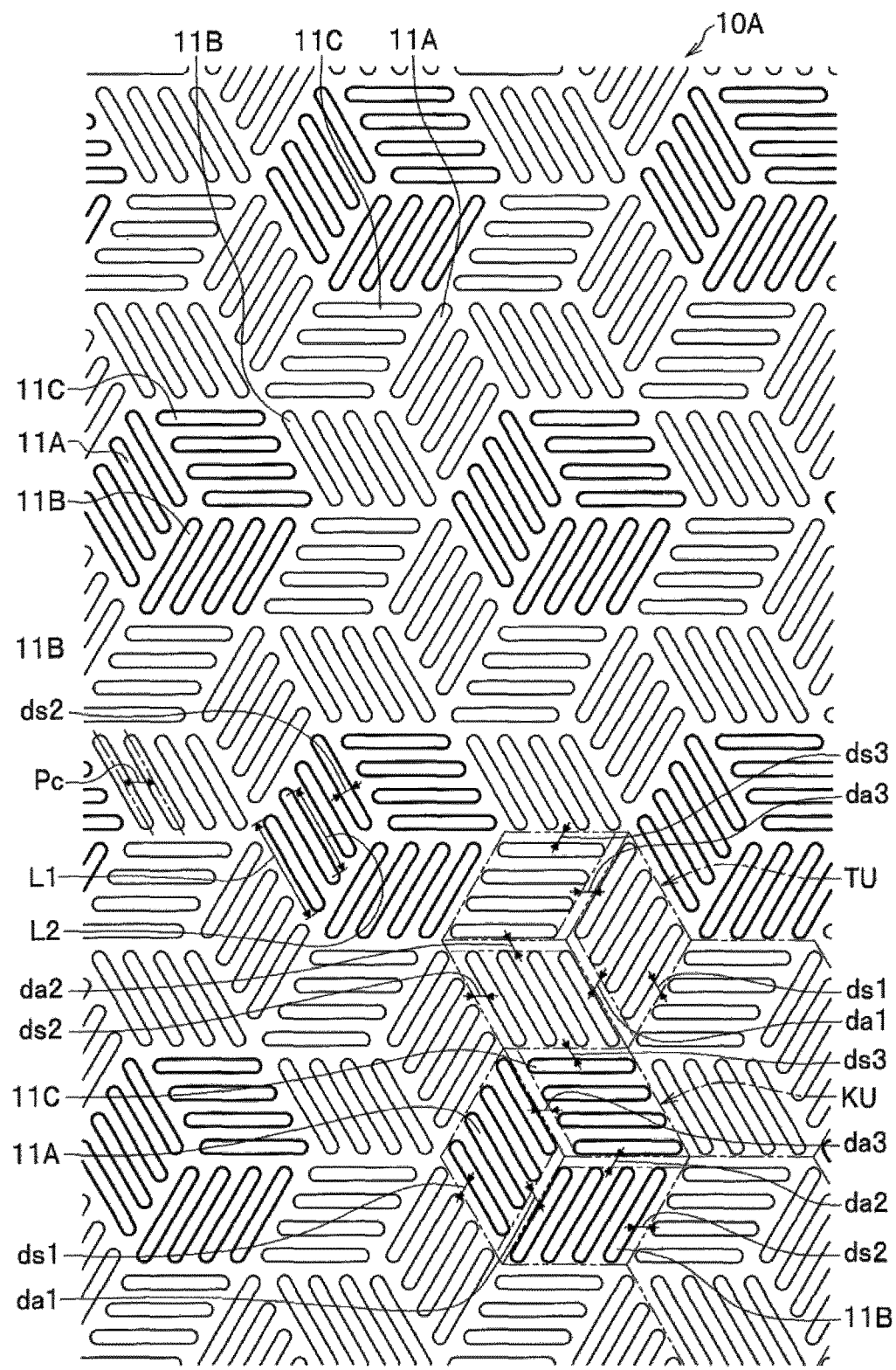
FIG. 12 is an enlarged plan view schematically showing convex portions formed at the sapphire substrate of the light-emitting element according to a second embodiment.

As shown in FIG. 12, the first convex portions 11A to third convex portions 11C in a light-emitting element according to the second embodiment are configured such that a first distance da1 to a third distance da3 and a fourth distance ds1 to a sixth distance ds3 are set larger, and the intervals between the adjacent first convex portions 11A, between the adjacent second convex portions 11B, and between the third convex portions 11C are wider, than the structure shown in FIG. 3. In the light-emitting element configured in this way, the first convex portions 11A to the third convex portions 11C of the sapphire substrate 10A take the specific unit pattern of the first unit KU and the second unit TU, and the respective intervals and/or distances are widened by 20% to 40%, compared to the structure shown in FIG. 3. Thus, the light-emitting element can more easily ensure the flatness when the semiconductor layer is completely grown. Note that when the interval between the convex portions 11 shown in FIG. 3 is set, for example, to 3 μm as the reference, the interval between the convex portions 11 shown in FIG. 12 is set in a range of 3.6 to 4.2 μm. Note that the expression "each of the intervals is widened by 20 to 40%" as used herein means that an average of the intervals is widened or increased by 20 to 40% in an allowable range when defining the average as a reference value. That is, each of the intervals is preferably set to the upper limit of the allowable range with respect to the reference value.

In the light-emitting element with the above-mentioned structure in the second embodiment, the outer edges in the longitudinal direction of the convex portions 11 disposed at the sapphire substrate 10A are arranged to extend along the respective m axes of the sapphire substrate 10A and formed such that the setting interval between the adjacent outer edges is wider by 20 to 40% than the reference value. This increases the time for the nitride semiconductor to grow in the lateral direction during the crystal growth of the nitride semiconductor. Thus, the dislocations occurring during the crystal growth of the nitride semiconductor tend to converge in a narrow range, resulting in a decrease in dislocation density of the nitride semiconductor layer 30. Further, the light-emitting element in the second embodiment can also improve the crystal orientation, thereby reducing the forward voltage (Vf) while maintaining or improving the temperature property, thus improving the optical output (Po). Together with this, the light-emitting element can also enhance the luminous efficiency.

Third Embodiment

Figure 13:
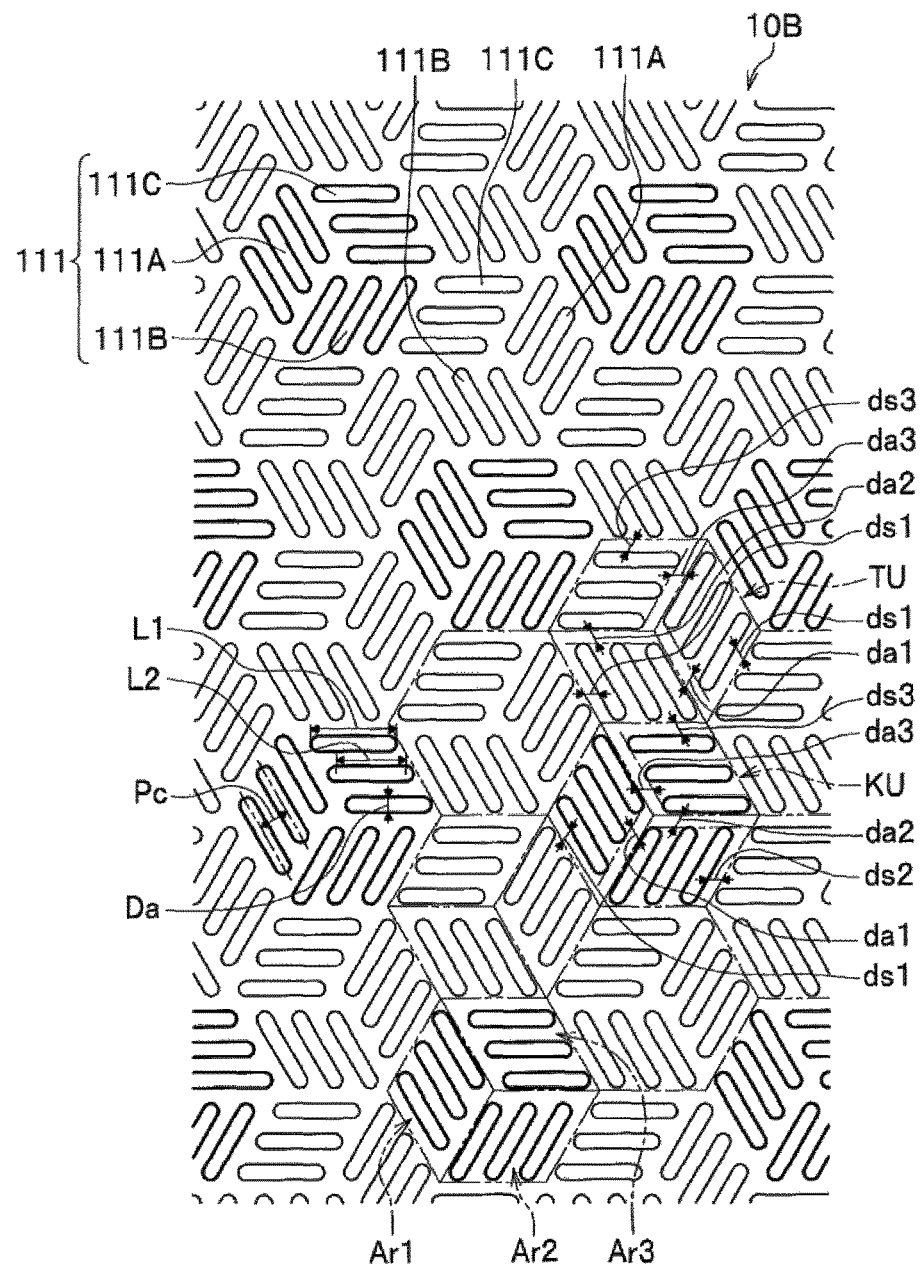
FIG. 13 is an enlarged plan view schematically showing convex portions formed at the sapphire substrate of the light-emitting element according to a third embodiment.

As shown in FIG. 13, in the planer view of a sapphire substrate 10B of a light-emitting element according to the third embodiment, three convex portions 111 are disposed in each of the virtual rhombic regions at the surface on the c-plane side of the sapphire substrate 10B such that the outer edge in the longitudinal direction of the convex portion extends along each m axis. Specifically, the convex portions 111 include first convex portions 111A each having its outer edge in the longitudinal direction of the elongated shape extending along the first m axis Sa1, second convex portions 111B each having its outer edge in the longitudinal direction of the elongated shape extending along the second m axis Sa2, and third convex portions 111C each having its outer edge in the longitudinal direction of the elongated shape extending along the third m axis Sa3.

Here, in the first to third convex portions 111A to 111C, the interval between the respective adjacent convex portions is set to be equal to or more than a core diameter of the corresponding convex portion. Note that a pitch Pc between the convex portions 111 (when drawing a center line through the center of the core diameter of each convex portion along the longitudinal direction of the convex portion, the distance to the center line of another adjacent convex portion) is set to exceed the core diameter Da. In the first convex portions 111A to the third convex portions 111C, the interval and pitch Pc between the convex portions are set wider, and the first distance da1 to the third distance da3 and the fourth distance ds1 to the sixth distance ds3 are also set wider depending on the interval between the convex portions. Here, the first convex portions 111A to the third convex portions 111C are set such that the ratio of the core diameter Da to the whole core length L1 is in a range of 1:5 to 6 by way of example. Furthermore, the relationship between the core diameter Da and the pitch Pc is set to 1:2 by way of example.

In the light-emitting element with the above-mentioned structure according to the third embodiment, a distance between the convex portion 111 formed on the sapphire substrate 10B and a flat part thereof with no convex portion 111 is appropriately adjusted, which increases the time for the nitride semiconductor to grow in the lateral direction during the crystal growth, easily causing dislocations generated during the crystal growth to converge in a narrow range, resulting in a decrease in dislocation density of the nitride semiconductor layer 30. Further, the light-emitting element in the third embodiment can also improve the crystal orientation, thereby reducing the forward voltage (Vf) while maintaining or improving the temperature property to improve the optical output (Po). Together with this, the luminous efficiency can be improved.

Fourth Embodiment

Figure 14:
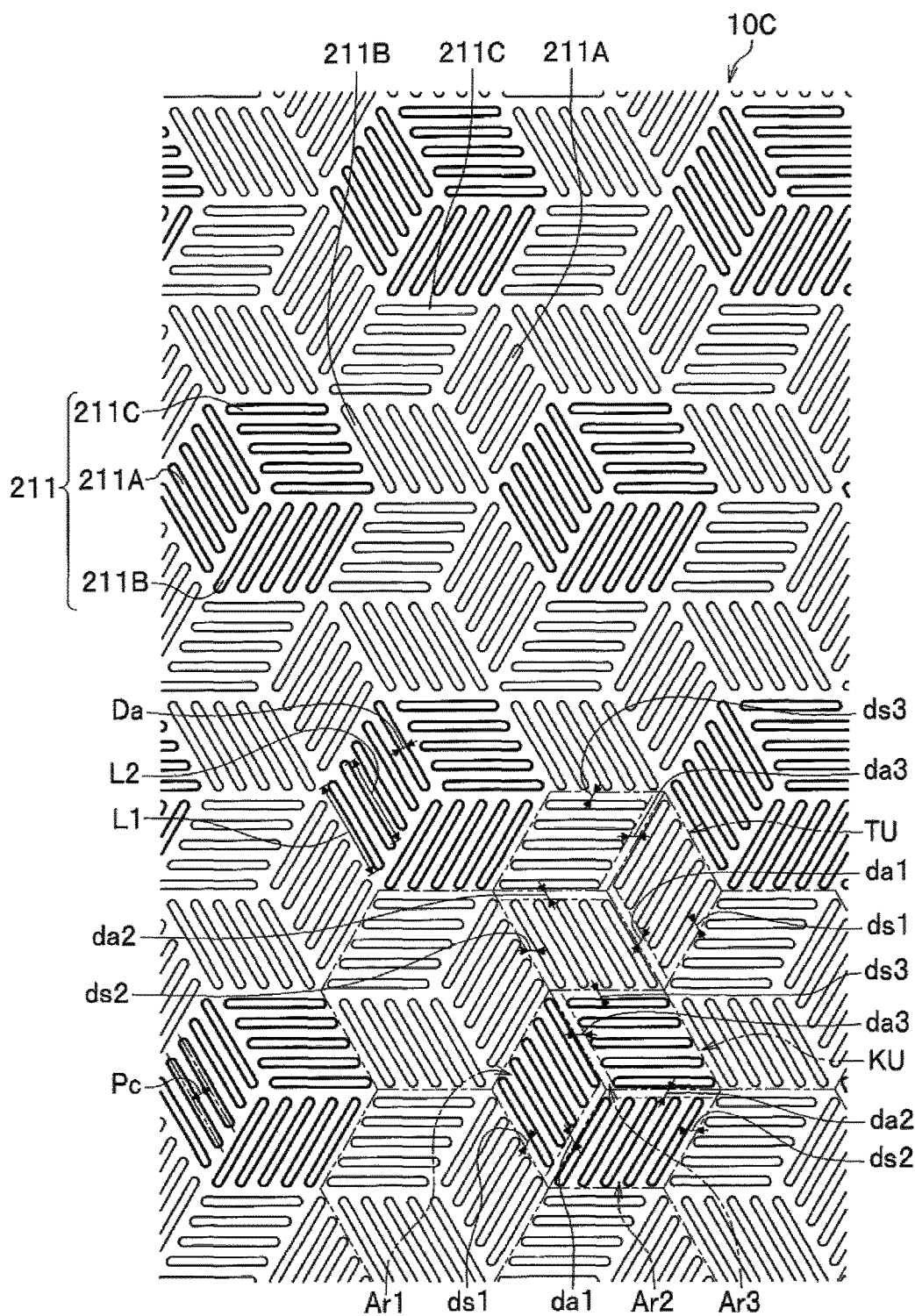
FIG. 14 is an enlarged plan view schematically showing convex portions formed at the sapphire substrate of the light-emitting element according to a fourth embodiment.

As shown in FIG. 14, in the plan view of a sapphire substrate 10C of a light-emitting element in the fourth embodiment, five convex portions 211 extend along each m axis in the corresponding virtual rhombic region to be arranged at predetermined intervals, at the surface on the c-plane side of the sapphire substrate 10C. Specifically, the first-unit convex portions 211 include first convex portions 211A each having its outer edge in the longitudinal direction of the elongated shape extending along the first m axis Sa1, second convex portions 211B each having its outer edge in the longitudinal direction of the elongated shape extending along the second m axis Sa2, and third convex portions 211C each having its outer edge in the longitudinal direction of the elongated shape extending along the third m axis Sa3. The first convex portions 211A to the third convex portions 211C are set such that the ratio of the core diameter Da to the whole core length L1 is 1:11.5, and such that the ratio of the core diameter Da to the pitch Pc is 1:2.5.

In this way, even if the ratio of the core diameter Da to the whole core length L1 is smaller than that in the structure shown in FIG. 3, the convex portions 211 are configured to take the specific unit patter of the first unit KU and the second unit TU and to make a space at the center of the unit. Thus, like the embodiments mentioned above, the light-emitting element can also improve the crystal orientation, thereby reducing the forward voltage Vf while maintaining or improving the temperature property to improve the optical output. Together with this, the luminous efficiency can also be enhanced. While the second to fourth embodiments have described above that the number of convex portions formed in each virtual rhombic region is set to three to five, the number of convex portions may be six or seven or more.

Figure 15:
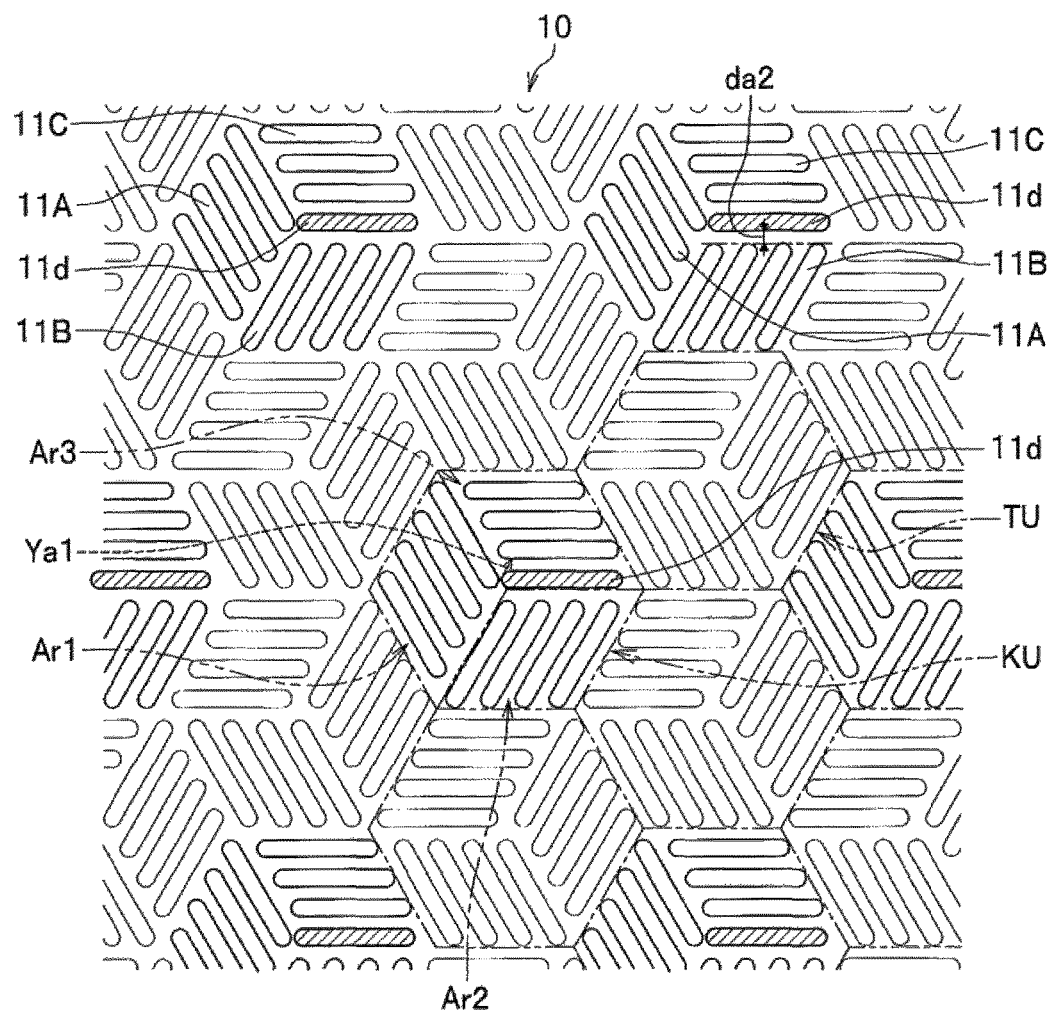
FIG. 15 is an enlarged plan view schematically showing convex portions formed at the sapphire substrate of a light-emitting element in a first modified example of the first to fourth embodiments.
Figure 16:
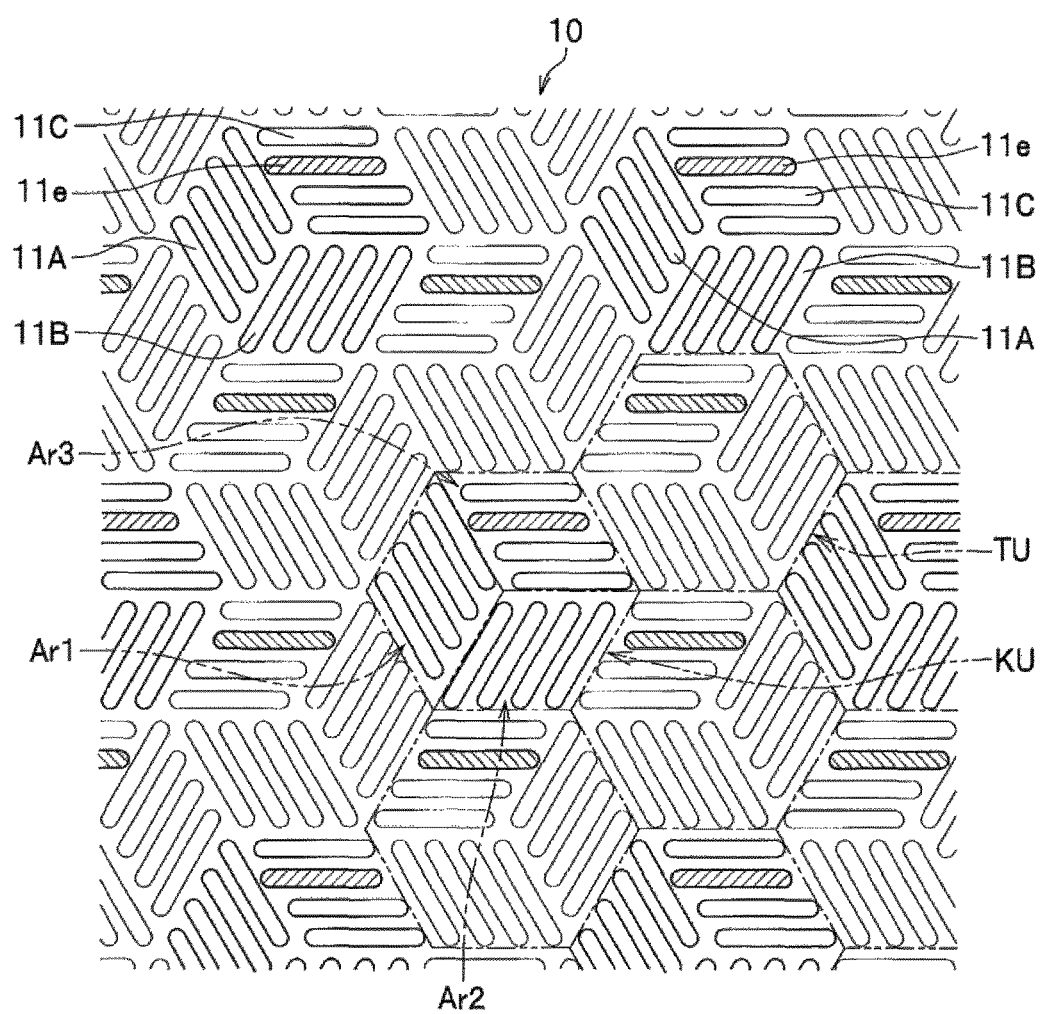
FIG. 16 is an enlarged plan view schematically showing convex portions formed at the sapphire substrate of a light-emitting element in a second modified example of the first to fourth embodiments.
Figure 17:
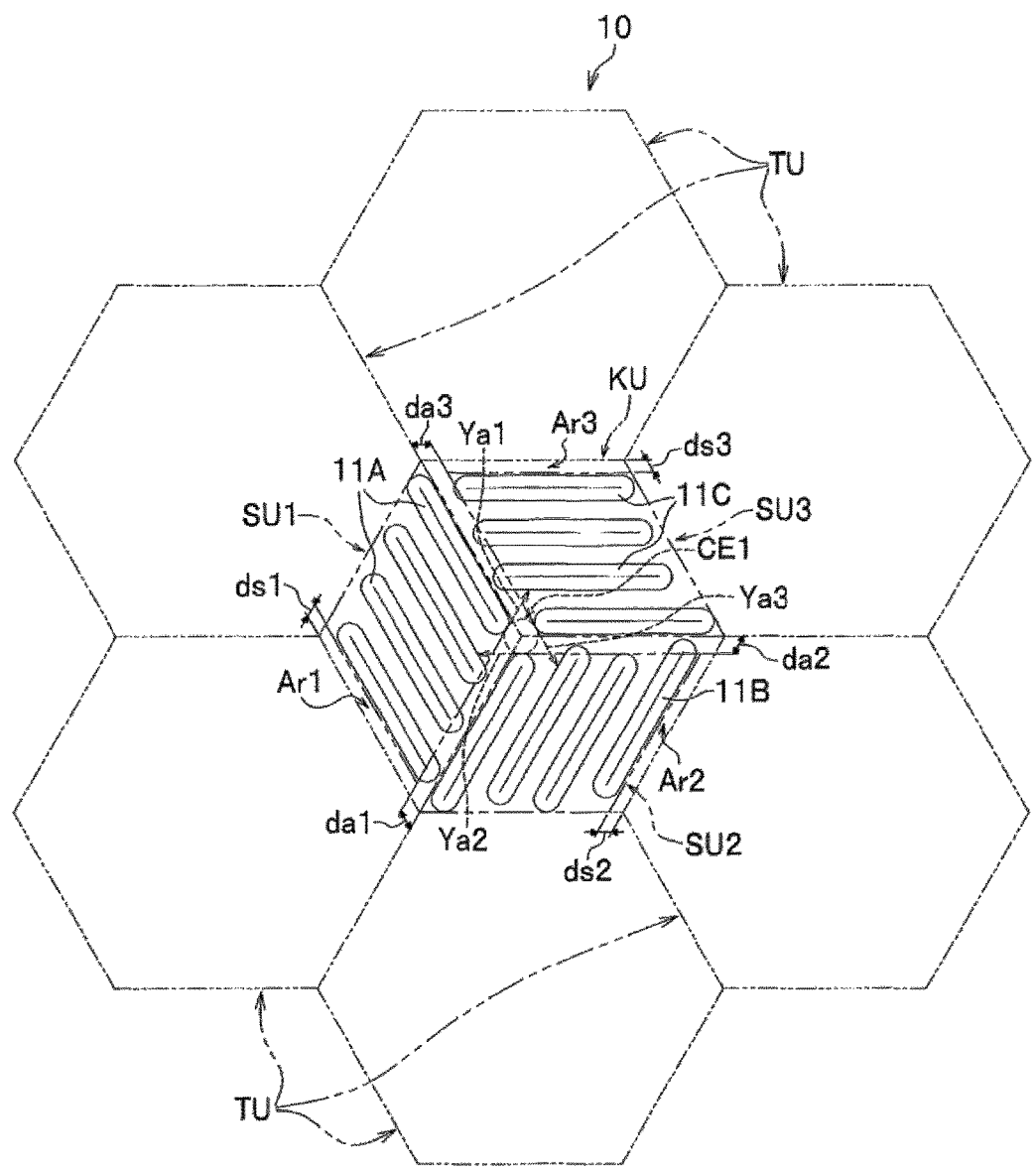
FIG. 17 is an enlarged plan view schematically showing convex portions formed at the sapphire substrate of a light-emitting element in a third modified example of the first to fourth embodiments.

While the above first to fourth embodiments have described that in the sapphire substrates 10 to 10C for the nitride semiconductor element, the convex portions 11, 111, and 211 in the elongated shape are arranged in such a manner as to align both ends of the adjacent convex portions with each other. For example, as shown in FIGS. 15 to 17, the convex portions may be disposed within the first region Ar1 to the third region Ar3 such that parts or all of both ends of the adjacent convex portions are displaced. The structure of the convex portion 11 of the sapphire substrate 10 shown in FIG. 3 will be described below as a typical one. However, other embodiments have the same function effects. In the description below, the location of the third convex portion 11c in the first unit KU located closest to the center thereof is changed by way of example. Alternatively, the location(s) of another or other third convex portion(s) 11c, or the location(s) of one or some of the first convex portions 11A or second convex portions 11B may be changed.

First Modified Example

As shown in FIG. 15, the first convex portions 11A to the third convex portions 11C of the first unit KU may partly include, for example, a convex portion 11d (convex portion hatched in the figure) that is arranged by displacing one end of one third convex portion 11C with respect to the other convex portions. The convex portion 11d is formed only in the first unit KU and not in the second unit TU. That is, in the second unit TU, the arrangement of the first region Ar1 to the third region Ar3 is required to have mirror symmetry, whereas in the first unit, the arrangement of the first convex portions 11A to the third convex portions 11C, including the convex portion 11d disposed in the unit does not have the mirror symmetry.

As shown in FIG. 15, when viewing an entirety of the unit pattern composed of the first unit KU of the arrangement of the first convex portions 11A to the third convex portions 11C, including the convex portion 11d, as well as the second unit TU of the arrangement of the first convex portions 11A to the third convex portions 11C, not including the convex portion 11d, the same unit pattern is repeated with the first unit KU centered. The convex portion 11d is provided by displacing the third convex portion 11C located closest to the center of the first unit KU with respect to the other third convex portions 11C. The convex portion 11d is disposed to be abutted against and intersect the tangent line Ya1. Note that the second distance da2 leads from the second region Ar2 to the first region Ar1, whereby the region or space at the center of the first unit KU is widely ensured. Therefore, as mentioned above, even when the convex portions 11 include the convex portion 11d in such a sapphire substrate 10, this modified example includes the specific unit pattern of the first unit KU and the second unit TU as well as the region at the center of the unit. Thus, like the embodiments described above, as compared to the related art structure, the light-emitting element can improve the crystal orientation, thereby reducing the forward voltage (Vf) while remaining or improving the temperature property to improve the light output (Po). Together with this, the luminous efficiency can also be improved.

Second Modified Example

As shown in FIG. 16, in the first unit KU and the second unit TU, one of the third convex portions 11C may be disposed as a convex portion 11e (convex portion hatched in the figure) to have its end displaced with respect to the other third convex portions 11C. Here, the second unit TU including the arrangement of the convex portion 11e has the mirror symmetry relative to the first unit KU. Even though there is the convex portion 11e having its one end displaced with respect to the other convex portions, in the first unit KU and the second unit TU in this way, the uniform arrangement is achieved as a whole for each unit pattern, in which the sides of the second units TU are aligned with the respective sides of one first unit KU. Therefore, as mentioned above, even though the convex portions 11 include the convex portion 11e in such a sapphire substrate 10, this modified example includes the specific unit pattern of the first unit KU and the second TU as well as the region, or space at the center part of the unit. Thus, like the embodiments or example described above, as compared to the related art structure, the light-emitting element can improve the crystal orientation, thereby reducing the forward voltage (Vf) while remaining or improving the temperature property to improve the light output (Po). Together with this, the luminous efficiency can also be improved.

Third Modified Example

Further, as shown in FIG. 17, the first unit KU may be configured such that the first convex portions 11A disposed in the first region Ar1, the second convex portions 11B disposed in the second region, and the third convex portions 11C disposed in the third region Ar3 may be disposed in different arrangements for each region. Referring to FIG. 17, the first distance da1 to the third distance da3 are the maximum distances. In the unit pattern, one side of the second unit TU that has the mirror symmetry relative to the arrangement of the first convex portion 11A to the third convex portion 11C in the first unit KU may be aligned with each side of the first unit KU. Further, for example, the second unit TU with the structure shown in FIG. 3, which differs from the first unit in arrangement of the first convex portions 11A to the third convex portions 11C, may be configured to be aligned with each side of the first unit KU shown in FIG. 17.

As shown in FIG. 17, even though the respective ends of the first convex portions 11A to the third convex portions 11C in the first units KU are positioned in different patterns, the same arrangement of the convex portions 11 is repeated every unit that includes the first unit KU and the second units TU disposed around the first unit KU as the center. Therefore, as mentioned above, even with the arrangement of the convex portions 11 in the sapphire substrate 10, this modified example includes the specific unit pattern of the first unit KU and the second TU as well as the region at the center part of the unit. Thus, like the embodiments described above, as compared to the structure of the related art, the light-emitting element can improve the crystal orientation, thereby reducing the forward voltage (Vf) while remaining or improving the temperature property to improve the light output (Po). Together with this, the luminous efficiency can also be improved.

The light-emitting elements in the respective embodiments described above may have the following structures. That is, in the sapphire substrate, as long as the convex portions can be arranged along the respective m axes in the first region Ar1 to the third region Ar3, as shown in FIGS. 3, and 12 to 17, the ends of the convex portions are aligned with each other, or alternatively may not partly or completely be aligned. In other words, in the first unit KU, two of three convex portions located closest to the center of the regular hexagon are spaced apart from each other without intersecting a facing one of the tangent lines Ya1 to Ya3, and the other convex portion may be disposed to form any of the first distance da1 to the third distance da3. The use of the unit pattern including the first unit KU and the second unit TU that has the mirror symmetry relative to the first unit can reduce the forward voltage (Vf), improving the temperature property, and also improving the power conversion efficiency (WPE) in the light-emitting element, as described above.

The unit pattern of the first unit and the second unit may be configured to align each side of the regular hexagon of the second unit with the side of the regular hexagon of the first unit.

Note that in the sapphire substrate, the convex portions 11 are arranged for each unit along the corresponding m axis. Thus, another convex portion 11 is disposed on an extended line in the longitudinal direction, which can suppress the leak of light in the transverse direction, thereby achieving light distribution characteristics close to those of a Lambertian.

As shown in FIGS. 3 and 12 to 17, both ends of each of the convex portions 11, 111, and 211 are semicircular and have substantially the same shape. However, the shapes of the convex portions 11, 111, and 211 are not limited thereto.

Further, the convex portions 11, 111, and 211 may be formed to protrude upward from the c-plane and sharpened from a predetermined position in the height direction at an angle θ with respect to a ridge line via an inclined surface. Thus, like the above-mentioned convex portions 11, 111, and 211, during crystal growth of the nitride semiconductor, the crystal growth from above the convex portion 12 is suppressed, causing the nitride semiconductor to grow in the lateral direction. The dislocations generated in the growth direction are allowed to converge, resulting in a decrease in the number of dislocations.

When forming the inclined surface, dry etching is performed, followed by wet etching, so that the inclined surface can be formed to be inclined toward the top part of each of the convex portions 11, 111, and 211.

Alternatively, in the first unit KU and the second unit TU of the light emitting elements 1 and 2, one of two other rhombic regions (second region Ar2 and third region Ar3) other than the first region Ar1 may include a plurality of third convex portions 11c that have their ends aligned along the extending direction of the first convex portion 11A (111A, 211A). One third convex portion 11C (111C, 211C) located closest to the center of the regular hexagonal region (first unit KU and second unit TU) may be arranged not to intersect the tangent line Ya3 that is in contact with the end on the center side of the first convex portion 11A (111A, 211A) located closest to the center, as well as in parallel to the direction of arrangement of the first convex portion 11A (111A, 211A).

Further, the above-mentioned light-emitting elements 1 and 2 may be configured as described below. The other of the above-mentioned two other rhombic regions (second region Ar2 and third region Ar3) may include a plurality of second convex portions 11B (111B, 211B) that have their ends aligned along the extending direction of the third convex portion 11C (111C, 211C). One second convex portion 11B (111B, 211B) located closest to the center of the regular hexagonal region (first unit KU and second unit TU) may be arranged not to intersect the tangent line that is in contact with one end on the center side of the third convex portion 11C (111C, 211C) located closest to the center, as well as in parallel to the direction in which the third convex portion 11C (111C, 211C) is disposed.

The terms "space" and "interval" are each used above depending on the described position, but substantially imply the same meaning.

DESCRIPTION OF REFERENCE NUMERALS 1, 2 light-emitting element
10, 10A, 10B, 10C, 10D sapphire substrate (substrate for nitride semiconductor element)
11, 111, 211 convex portion
11A, 111A, 211A first convex portion
11B, 111B, 211B second convex portion
11C, 111C, 211C third convex portion
20 buffer layer
30 nitride semiconductor layer (semiconductor layer)
31 n-type semiconductor layer
32 active layer
33 p-type semiconductor layer
40 n-side electrode
50 translucent electrode
60 p-side electrode
M mask
SC sapphire

What is claimed is:

1. A light-emitting element comprising:
a sapphire substrate having a c-plane at a main surface thereof; and
a semiconductor layer located on a main surface side of the sapphire substrate,
wherein the sapphire substrate comprises:
a first convex portion located at the main surface and having two longitudinal sides along a first m-axis of the sapphire substrate,
a second convex portion located at the main surface and having two longitudinal sides along a second m-axis of the sapphire substrate, and
a third convex portion located at the main surface and having two longitudinal sides along a third m-axis of the sapphire substrate,
wherein the second m-axis is rotated counterclockwise by 120° from the first m-axis, and the third m-axis is rotated counterclockwise by 120° from the second m-axis,
wherein a first line extending through the third convex portion and parallel to the third m-axis passes through the first convex portion in a plan view;
wherein a second line extending parallel to the second m-axis and tangent to an end of the first convex portion at a second-convex-portion side does not pass through the third convex portion; and
wherein the first convex portion and the third convex portion are on opposite sides of the second line.

2. The light-emitting element according to claim 1, wherein:
a third line extending through the first convex portion and parallel to the first m-axis passes through the second convex portion in a plan view; and a fourth line extending parallel to the third m-axis and tangent to an end of the second convex portion at a third-convex-portion side does not pass through the first convex portion.

3. The light-emitting element according to claim 2, wherein:
a fifth line extending through the second convex portion and parallel to the second m-axis passes through the third convex portion in a plan view; and
a sixth line extending parallel to the first m-axis and tangent to an end of the third convex portion at a first-convex-portion side does not pass through the second convex portion.

4. The light-emitting element according to claim 3, wherein:
the first line passes through a middle between the two longitudinal sides of the third convex portion;
the third line passes through a middle between the two longitudinal sides of the first convex portion; and
the fifth line passes through a middle between the two longitudinal sides of the second convex portion.

5. The light-emitting element according to claim 2, wherein:
the sapphire substrate comprises a first group of convex portions consisting of the first convex portion and one or more additional convex portions located at the main surface each of which has two longitudinal sides along the first m-axis,
the first convex portion is located closest to the third convex portion among the convex portions of the first group of convex portions, and
the second line is tangent to an end of each convex portion of the first group of convex portions at the second-convex-portion side in a plan view.

6. The light-emitting element according to claim 5, wherein a seventh line extending parallel to the second m-axis is tangent to an end of each of the convex portions of the first group of convex portions at a side opposite the second-convex-portion side in a plan view.

7. The light-emitting element according to claim 5, wherein the fourth line passes through the convex portions of the first group of convex portions except for the first convex portion in a plan view.

8. The light-emitting element according to claim 5, wherein:
the sapphire substrate comprises a second group of convex portions consisting of the second convex portion and one or more additional convex portions located at the main surface each of which has two longitudinal sides along the second m-axis,
the second convex portion is located closest to the first convex portion among the convex portions of the second group of convex portions, and
the fourth line is tangent to an end of each convex portion of the second group of convex portions at a third-convex-portion side in a plan view.

9. The light-emitting element according to claim 8, wherein an eighth line extending parallel to the third m-axis is tangent to an end of each of the convex portions of the second group of convex portions at a side opposite the third-convex-portion side in a plan view.

10. The light-emitting element according to claim 8, wherein a sixth line extending parallel to the first m-axis and tangent to an end of the third convex portion at a first-convex-portion side passes through the convex portions of the second group of convex portions except for the second convex portion in a plan view.

11. The light-emitting element according to claim 8, wherein:
the sapphire substrate comprises a third group of convex portions consisting of the third convex portion and one or more additional convex portions located at the main surface each of which has two longitudinal sides along the third m-axis,
the third convex portion is located closest to the second convex portion among the convex portions of the third group of convex portions, and
a sixth line extending parallel to the first m-axis and tangent to an end of the third convex portion at a first-convex-portion side is tangent to an end of each convex portion of the third group of convex portions at the first-convex-portion side in a plan view.

12. The light-emitting element according to claim 11, wherein a ninth line extending parallel to the first m-axis is tangent to an end of each of the convex portions of the third group of convex portions at a side opposite the first-convex-portion side in a plan view.

13. The light-emitting element according to claim 11, wherein the second line passes through the convex portions of the third group of convex portions except for the third convex portion in a plan view.

14. The light-emitting element according to claim 11, wherein:
the second convex portion is spaced from the second line by a first distance;
the third convex portion is spaced from the fourth line by a second distance;
the first convex portion is spaced from the sixth line by a third distance; and
the first distance, the second distance and the third distance are the same.

15. The light-emitting element according to claim 14, wherein:
a first area of the substrate, defined by projecting a space between the second convex portion and the second line along the second line, does not overlap with the third convex portion;
a second area of the substrate, defined by projecting a space between the third convex portion and the fourth line along the fourth line, does not overlap with the first convex portion; and
a third area of the substrate, defined by projecting a space between the first convex portion and the sixth line along the sixth line, does not overlap with the second convex portion.

16. The light-emitting element according to claim 15, wherein:
the first area overlaps with the additional convex portion of the third group of convex portions that is closest to the third convex portion;
the second area overlaps with the additional convex portion of the first group of convex portions that is closest to the first convex portion; and
the third area overlaps with the additional convex portion of the second group of convex portions that is closest to the second convex portion.

17. The light-emitting element according to claim 11, wherein the convex portions of the first group of convex portions, the convex portions of the second group of convex portions, and the convex portions of the third group of convex portions have three-fold rotational symmetry about a c-axis of the sapphire substrate.

18. The light-emitting element according to claim 11, wherein each of the convex portions of the first group of convex portions, the convex portions of the second group of convex portions and the convex portions of the third group of convex portions has a cross-sectional shape in which an upper part of the convex portion comes to a point, the cross-section being taken along a direction perpendicular to the longitudinal sides of each convex portion.

19. The light-emitting element according to claim 11, wherein:
the convex portions of the first group of convex portions have a same pitch therebetween;
the convex portions of the second group of convex portions have a same pitch therebetween; and
the convex portions of the third group of convex portions have a same pitch therebetween.

20. The light-emitting element according to claim 11, wherein the sapphire substrate comprises:
a first unit including a first region, a second region, and a third region, wherein the first, second, and third regions together have a shape of a regular hexagon that is evenly divided into the first, second, and third regions such that each region has a shape of a rhombus in a plan view, the first region being defined by sides that are respectively parallel to the first m-axis and the second m-axis, the second region being defined by sides that are respectively parallel to the second m-axis and the third m-axis, and the third region being defined by sides that are respectively parallel to the first m-axis and the third m-axis;
wherein the convex portions of the first group of convex portions are located in the first region; the convex portions of the second group of convex portions are located in the second region; and the convex portions of the third group of convex portions are located in the third region.

21. The light-emitting element according to claim 2, wherein:
the second convex portion is spaced from the second line by a first distance;
the third convex portion is spaced from the fourth line by a second distance;
the first convex portion is spaced from a sixth line extending parallel to the first m-axis and tangent to an end of the third convex portion at a first-convex-portion side by a third distance; and
the first distance, the second distance and the third distance are the same.

22. The light-emitting element according to claim 21, wherein:
a first area of the substrate, defined by projecting a space between the second convex portion and the second line along the second line, does not overlap with the third convex portion;
a second area of the substrate, defined by projecting a space between the third convex portion and the fourth line along the fourth line, does not overlap with the first convex portion; and
a third area of the substrate, defined by projecting a space between the first convex portion and the sixth line along the sixth line, does not overlap with the second convex portion.

23. The light-emitting element according to claim 2, wherein each of the first convex portion, the second convex portion and the third convex portion has a cross-sectional shape in which an upper part of the convex portion comes to a point, the cross-section being taken along a direction perpendicular to the longitudinal sides of each convex portion.

* * * * *